(12) United States Patent
Meiser et al.

(10) Patent No.: US 10,439,030 B2
(45) Date of Patent: *Oct. 8, 2019

(54) SEMICONDUCTOR DEVICE HAVING A CHANNEL REGION PATTERNED INTO A RIDGE BY ADJACENT GATE TRENCHES

(71) Applicant: Infineon Technologies AG, Neubiberg (DE)

(72) Inventors: Andreas Meiser, Sauerlach (DE); Rolf Weis, Dresden (DE); Franz Hirler, Isen (DE); Martin Vielemeyer, Villach (AT); Markus Zundel, Egmating (DE); Peter Irsigler, Obernberg am Inn (AT)

(73) Assignee: Infineon Technologies AG, Neubiberg (DE)

( * ) Notice: Subject to any disclaimer, the term of this patent is extended or adjusted under 35 U.S.C. 154(b) by 172 days.

This patent is subject to a terminal disclaimer.

(21) Appl. No.: 15/646,152

(22) Filed: Jul. 11, 2017

(65) Prior Publication Data

US 2017/0317176 A1 Nov. 2, 2017

Related U.S. Application Data

(63) Continuation of application No. 14/082,491, filed on Nov. 18, 2013, now Pat. No. 9,735,243.

(51) Int. Cl.
*H01L 29/92* (2006.01)
*H01L 29/417* (2006.01)
(Continued)

(52) U.S. Cl.
CPC ...... *H01L 29/4175* (2013.01); *H01L 29/4236* (2013.01); *H01L 29/66659* (2013.01);
(Continued)

(58) Field of Classification Search
None
See application file for complete search history.

(56) References Cited

U.S. PATENT DOCUMENTS

| 6,353,252 B1 | 3/2002 | Yasuhara et al. |
| 6,525,375 B1 | 2/2003 | Yamaguchi et al. |
| (Continued) | | |

FOREIGN PATENT DOCUMENTS

| CN | 102157493 A | 8/2011 |
| JP | 2001274398 A | 10/2001 |

*Primary Examiner* — Ali Naraghi
(74) *Attorney, Agent, or Firm* — Murphy, Bilak & Homiller, PLLC

(57) ABSTRACT

A semiconductor device includes a transistor in a semiconductor body having a first main surface. The transistor includes: a source contact electrically connected to a source region; a drain contact electrically connected to a drain region; a gate electrode at the channel region, the channel region and a drift zone disposed along a first direction between the source and drain regions, the first direction being parallel to the first main surface, the channel region patterned into a ridge by adjacent gate trenches formed in the first main surface, the adjacent gate trenches spaced apart in a second direction perpendicular to the first direction, a longitudinal axis of the ridge extending in the first direction and a longitudinal axis of the gate trenches extending in the first direction; and at least one of the source and drain contacts being adjacent to a second main surface opposite the first main surface.

20 Claims, 18 Drawing Sheets

(51) Int. Cl.

|  |  |
|---|---|
| *H01L 29/423* | (2006.01) |
| *H01L 29/66* | (2006.01) |
| *H01L 29/78* | (2006.01) |
| *H01L 29/40* | (2006.01) |
| *H01L 29/10* | (2006.01) |
| *H01L 27/12* | (2006.01) |
| *H01L 29/06* | (2006.01) |

(52) U.S. Cl.
CPC .. *H01L 29/66681* (2013.01); *H01L 29/66696* (2013.01); *H01L 29/7824* (2013.01); *H01L 29/7825* (2013.01); *H01L 29/7826* (2013.01); *H01L 29/7835* (2013.01); *H01L 27/1203* (2013.01); *H01L 29/0692* (2013.01); *H01L 29/0696* (2013.01); *H01L 29/1095* (2013.01); *H01L 29/402* (2013.01); *H01L 29/407* (2013.01); *H01L 29/41766* (2013.01)

(56) References Cited

U.S. PATENT DOCUMENTS

| | | |
|---|---|---|
| 9,070,576 B2 | 6/2015 | Zuo et al. |
| 9,123,803 B2 | 9/2015 | Xiao |
| 9,735,243 B2 * | 8/2017 | Meiser ................ H01L 29/4175 |
| 2002/0155685 A1 | 10/2002 | Sakakibara |
| 2004/0065919 A1 * | 4/2004 | Wilson ................ H01L 29/7835 |
| | | 257/329 |
| 2006/0095873 A1 | 5/2006 | Kaya |
| 2009/0256212 A1 * | 10/2009 | Denison .............. H01L 29/0653 |
| | | 257/408 |
| 2009/0321802 A1 * | 12/2009 | Choi ....................... H01L 29/94 |
| | | 257/296 |
| 2010/0327349 A1 | 12/2010 | Arie et al. |
| 2011/0018058 A1 | 1/2011 | Disney |
| 2011/0127586 A1 | 6/2011 | Bobde et al. |
| 2012/0175635 A1 | 7/2012 | Weis et al. |
| 2012/0211834 A1 | 8/2012 | Yang et al. |
| 2012/0289003 A1 | 11/2012 | Hirler et al. |
| 2012/0314453 A1 | 12/2012 | Disney et al. |
| 2014/0084362 A1 | 3/2014 | Schloesser et al. |
| 2014/0151798 A1 | 6/2014 | Meiser et al. |
| 2014/0151804 A1 | 6/2014 | Meiser et al. |
| 2014/0167144 A1 | 6/2014 | Tsuchiko et al. |
| 2014/0183629 A1 | 7/2014 | Meiser et al. |

* cited by examiner

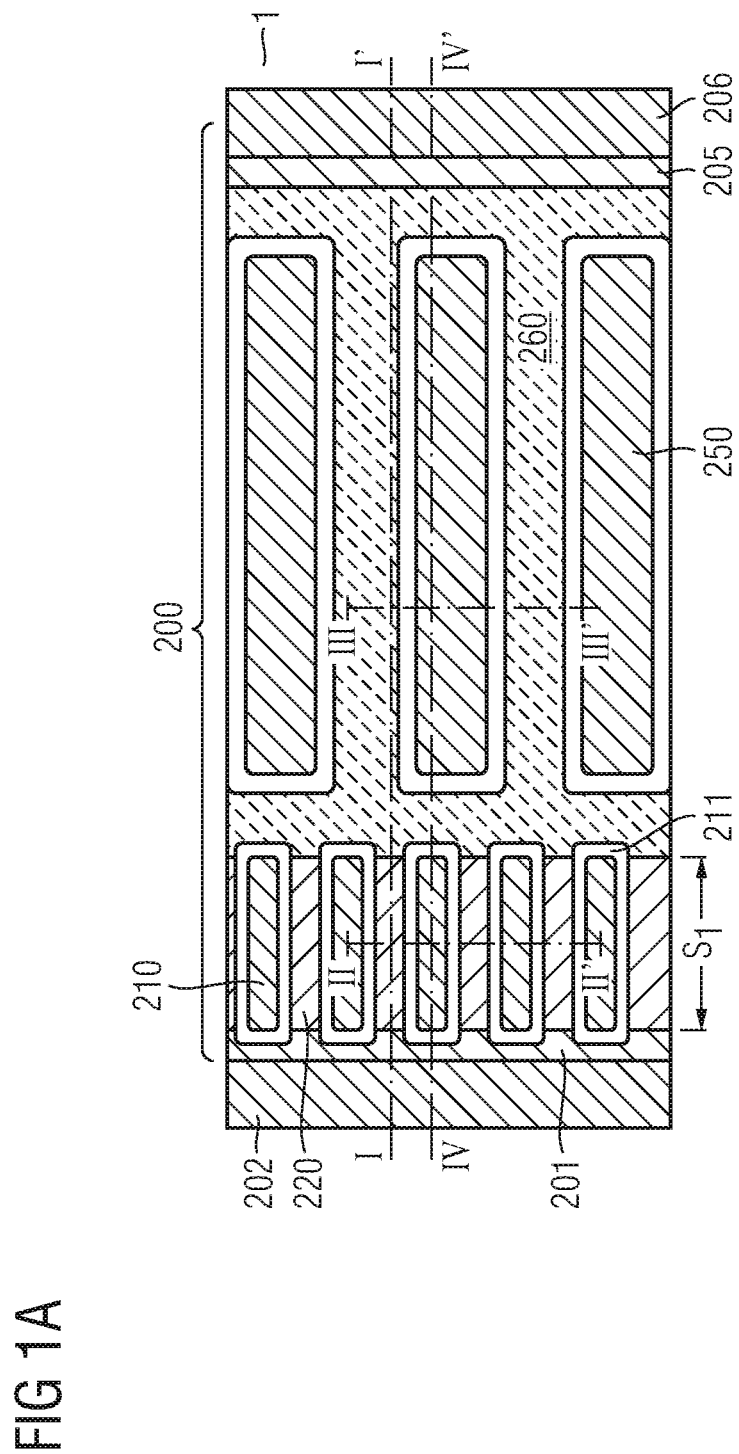

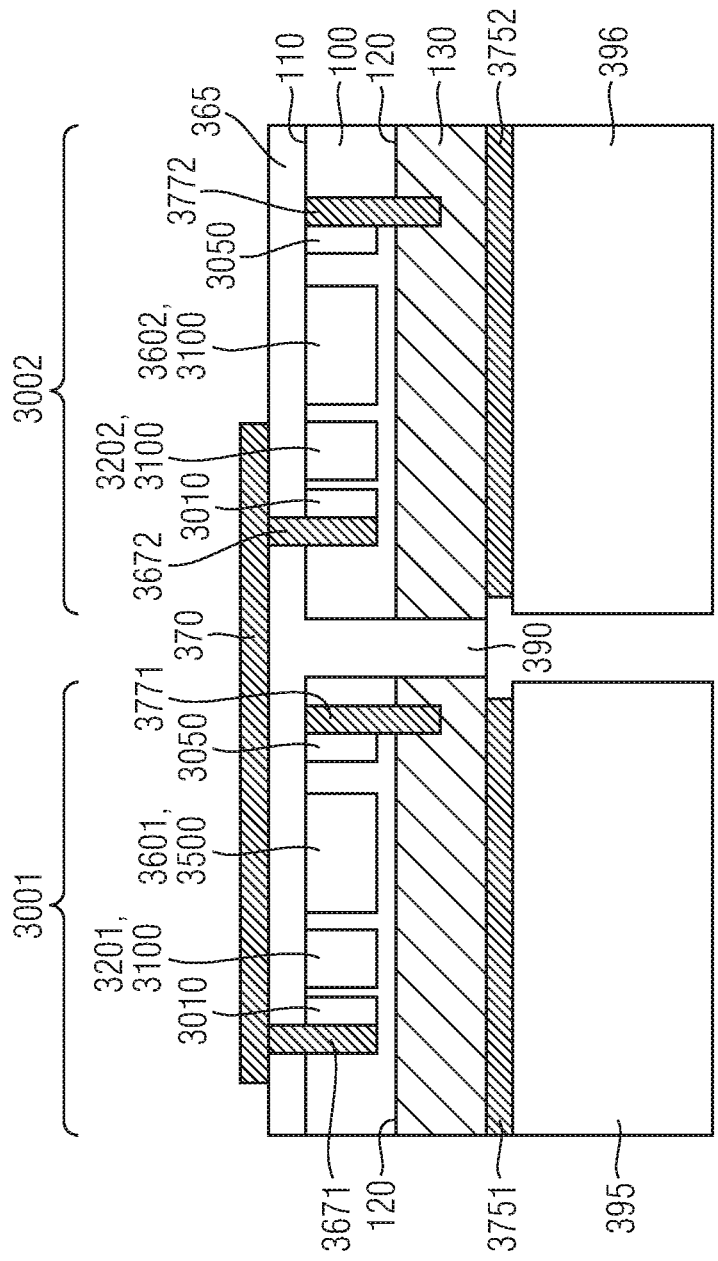

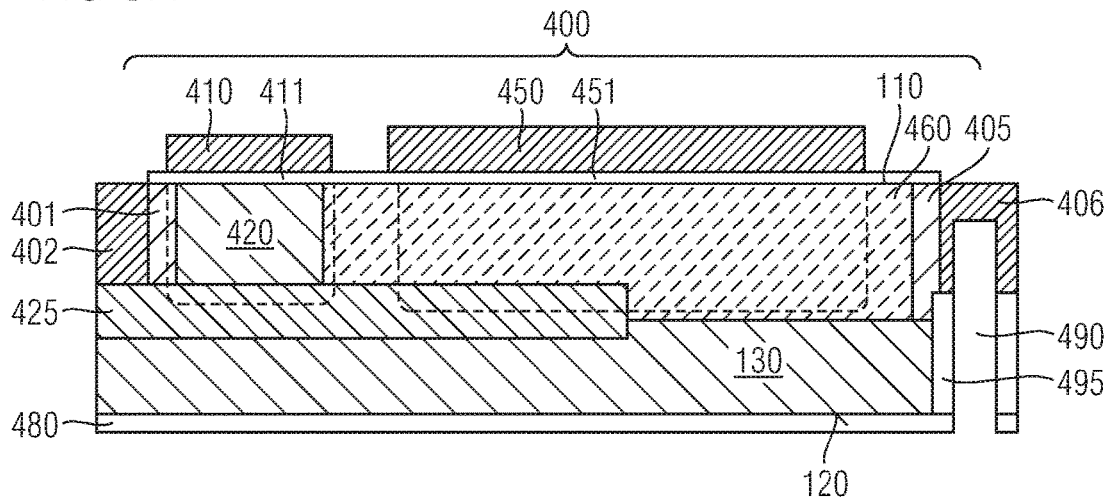
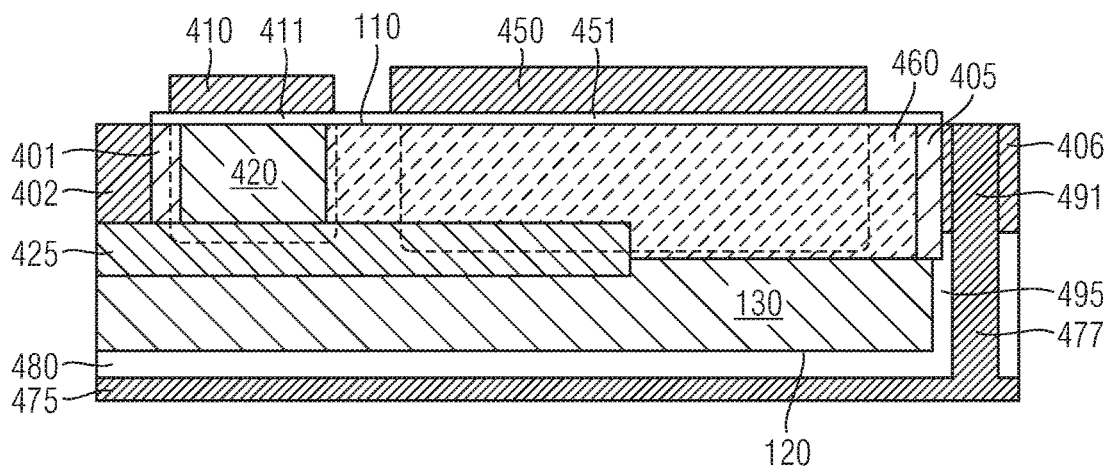
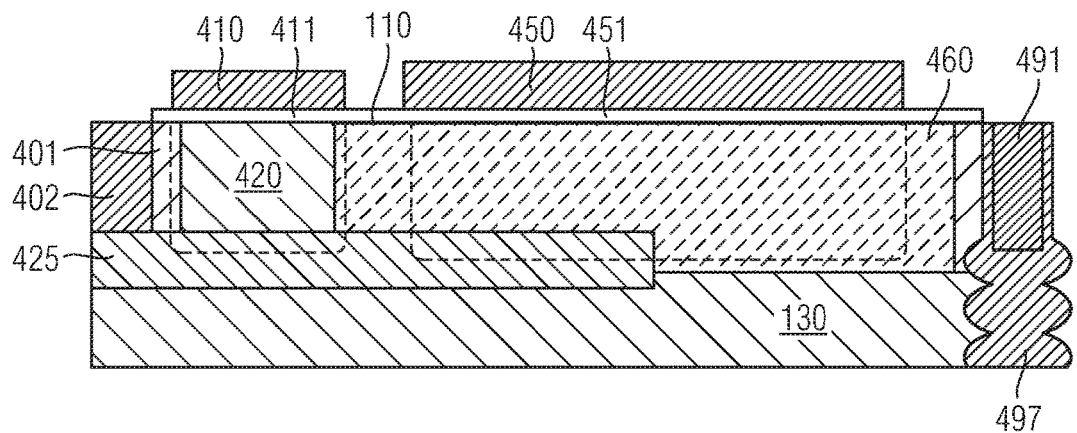

SEMICONDUCTOR DEVICE HAVING A CHANNEL REGION PATTERNED INTO A RIDGE BY ADJACENT GATE TRENCHES

BACKGROUND

Power transistors commonly employed in automotive and industrial electronics require a low on-state resistance ($R_{on}$), while securing a high voltage blocking capability. For example, a MOS ("metal oxide semiconductor") power transistor should, depending upon application requirements, be capable of blocking drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which current flow mainly takes place parallel to a main surface of a semiconductor substrate, are useful for integrated circuits in which further components, such as switches, bridges and control circuits are integrated.

For example, power transistors may be used in DC/DC or AC/DC converters to switch a current through an inductor, in these converters frequencies in a range from several kHz up to several MHz are employed. In order to reduce switching losses, attempts are being made to minimize capacitances in the power transistors. This in turn allows for accelerated switching capacity.

At higher currents problems may arise when the source and the drain regions are to be contacted from the first main surface, due to the limited possibilities of contacting the source and the drain regions. For these reasons, attempts are being made to provide a quasi-vertical semiconductor device.

SUMMARY

According to an embodiment, a semiconductor device comprises a transistor in a semiconductor body having a first main surface. The transistor comprises a source region, a drain region, a channel region, a drift zone, a source contact electrically connected to the source region, a drain contact electrically connected to the drain region, a gate electrode at the channel region, the channel region and the drift zone being disposed along a first direction between the source region and the drain region, the first direction being parallel to the first main surface, the channel region having a shape of a first ridge extending along the first direction. One of the source contact and the drain contact is adjacent to the first main surface, the other one of the source contact and the drain contact is adjacent to a second main surface that is opposite to the first main surface.

According to a further embodiment, an integrated circuit comprises first and second transistors in a semiconductor body having a first main surface, respectively. Each of the first and the second transistors comprises a source region, a drain region, a channel region, a drift zone, a source contact electrically connected to the source region, a drain contact electrically connected to the drain region, a gate electrode at the channel region. The channel region and the drift zone are disposed along a first direction between the source region and the drain region. The first direction is parallel to the first main surface. The channel region has a shape of a first ridge extending along the first direction. One of the source contact and the drain contact of the first transistor are adjacent to the first main surface, the other one of the source contact and the drain contact of the first transistor is adjacent to a second main surface that is opposite to the first main surface.

According to an embodiment, a method of manufacturing a semiconductor device comprises forming a transistor in a semiconductor body having a first main surface. The method comprises forming a source region and drain region adjacent to the first main surface, forming a channel region and a drift zone adjacent to the first main surface, forming a gate electrode between the source and the drain region, forming a gate electrode including forming a gate trench in the first main surface, and forming a contact opening extending from the first main surface to a second main surface that is opposite to the first main surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a plan view of a semiconductor device according to an embodiment;

FIG. 2C shows a cross-sectional view of an integrated circuit according to an embodiment;

FIG. 3A shows a cross-sectional view of a semiconductor device according to an embodiment;

FIG. 3B shows a cross-sectional view of a semiconductor device according to an embodiment;

FIG. 3C shows a cross-sectional view of a semiconductor device according to an embodiment;

DETAILED DESCRIPTION

Figure 1B:
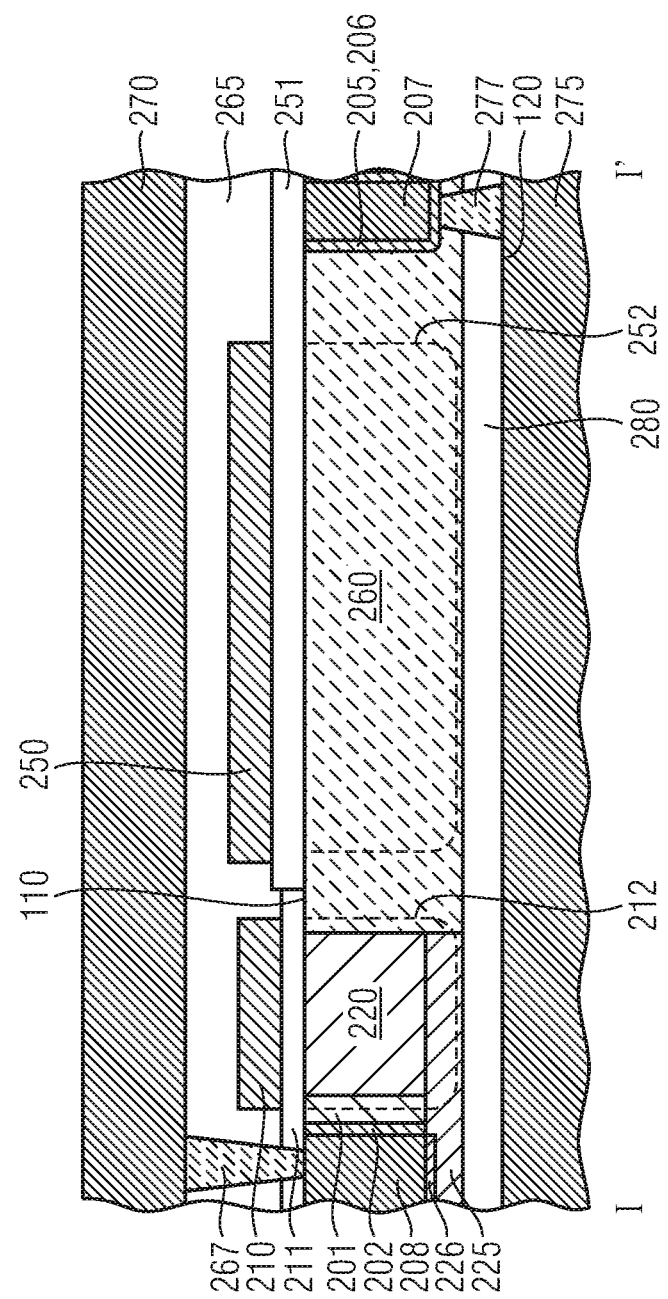
FIG. 1B shows a cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top," "bottom," "front," "back," "leading," "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer," "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The term "semiconductor body" may include any of the above mentioned examples of a substrate. Specifically, this term may refer to a semiconductor layer, in particular, a monocrystalline semiconductor layer in which components of a semiconductor device may be manufactured. For example, the term "semiconductor body" may refer to a part of a layered structure or to a part of an SOI substrate.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

Figure 1C:
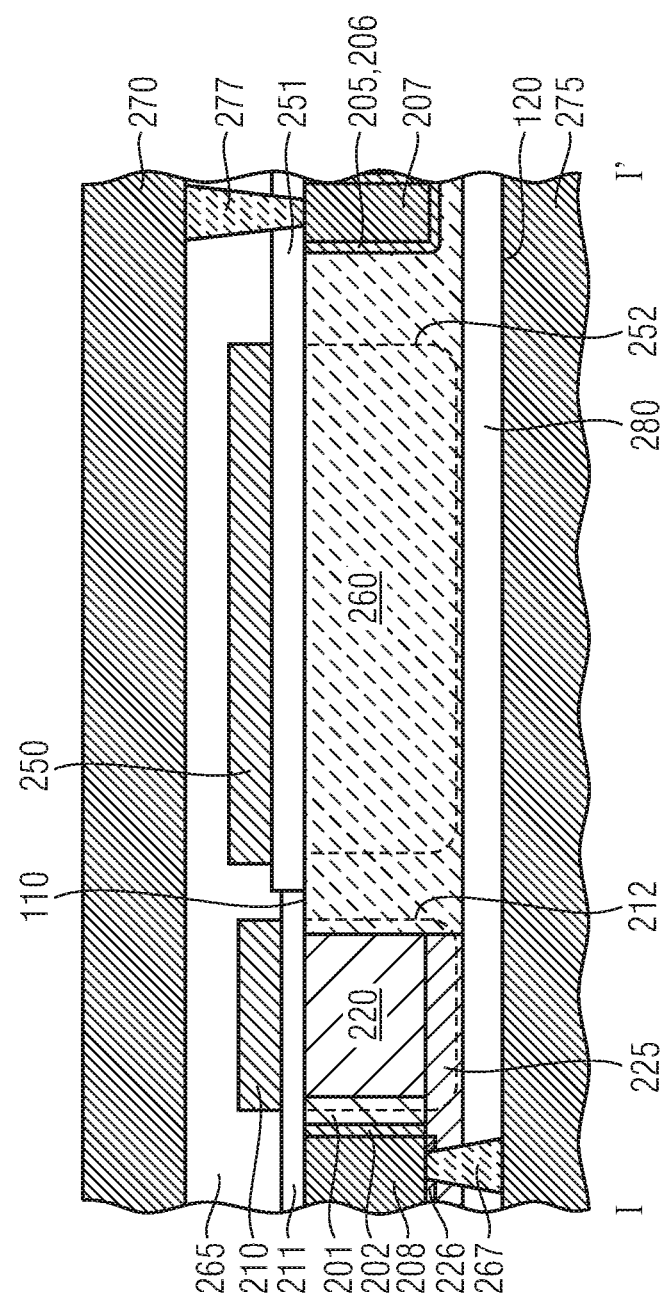
FIG. 1C shows a cross-sectional view of a semiconductor device according to a further embodiment.

FIG. 1A shows a plan view of a semiconductor device according to an embodiment, and FIGS. 1B and 1C show cross-sectional views of the semiconductor device which are taken between I and I'.

The semiconductor device shown in FIG. 1 comprises a plurality of transistor cells, the transistor cells including a source region 201, a drain region 205, a channel region 220 and a drift zone 260. The transistor cells are connected in parallel, so that the source regions 201 and the drain regions 205 may form one single area. The source region 201, the drain region 205 and the drift zone 260 may have a first conductivity type and may be doped with dopants of the first conductivity type, for example n-type dopants. The doping concentration of the source and the drain region 201, 205 may be higher than a doping concentration of the drift zone 260. The channel region 220 is arranged between the source region 201 and the drift zone 260. The channel region 220 has a second conductivity type and is doped with dopants of the second conductivity type, for example, p-type dopants. The drift zone 260 may be arranged between the channel region 220 and the drain region 205. The source region 201, the channel region 220, the drift zone 260 and the drain region 205 are disposed along a first direction. The first direction extends from I to I' parallel to a first main surface of the semiconductor body or substrate.

When a suitable voltage is applied to the gate electrode 210, the conductivity of a channel that is formed in the channel region 220 will be controlled by the gate voltage. The gate electrode 210 is insulated from the channel region 220 by means of an insulating gate dielectric material 201 such as silicon oxide. By controlling the conductivity of a channel formed in the channel region, the current flow from the source region 201 via the channel formed in the channel region 220 and the drift zone 260 to the drain region 205 may be controlled. The transistor 200 may further comprise a field plate 250 that is arranged adjacent to the drift zone 260. The field plate 250 is insulated from the drift zone 260 by means of an insulating field dielectric layer 251 such as a field oxide.

The source region 201 is connected to the source electrode 202. The drain region 205 is connected to the drain electrode 206.

When being switched on, an inversion layer is formed at the boundary between the channel region 220 and the insulating gate dielectric material 211. Accordingly, the transistor is in a conducting state from the source region 201 to the drain region 205 via the drift zone 260. When the transistor is switched off, no conductive channel is formed at the boundary between the channel region 220 and the insulating gate dielectric material 211 so that no current flows. Further, an appropriate voltage may be applied to the field plate 250 in an off-state. In an off-state the field plate depletes charge carriers from the drift zone so that the breakdown voltage characteristics of the transistor 200 are improved. In a semiconductor device comprising a field plate, the doping concentration of the drift zone may be increased without deteriorating the breakdown voltage characteristics in comparison to a device without a field plate. Due to the higher doping concentration of the drift zone, the on-resistance $Rds_{on}$ is further decreased resulting in improved device characteristics.

FIGS. 1B and 1C show examples of cross-sectional views of the semiconductor device illustrated in FIG. 1A between I and I'. The direction between I and I' corresponds to the first direction. As is shown, the source region 201 extends from the first main surface 110 in a depth direction of the body 100, i.e. perpendicularly with respect to the first main surface 110. The channel region 220 and the drift zone 260 are disposed along a first direction which is parallel to the first main surface 110 between the source region 201 and the drain region 205. The drain region 205 likewise extends from the first main surface 110 in a depth direction of the body. The drain region 205 may be implemented by a conductive layer that forms a drain electrode 206. Optionally, the drain region 205 may comprise a doped region of the first conductivity type. As is indicated by dotted lines, in a plane before and behind the depicted plane of the drawing, gate trenches 212 are disposed adjacent to the channel region 220. In a corresponding manner, field plate trenches 252 may be disposed adjacent to the drift zone 260. The gate trench 212 and the field plate trench 252 extend from the first main surface 110 in a depth direction of the body. As a consequence, the channel region 220 has the shape of a first ridge. Due to the presence of the field plate trenches 252, also e drift zone 260 has the shape of a second ridge.

The semiconductor devices of FIGS. 1B and 1C further comprise a front side metallization 270 that is insulated from the first main surface 110 by means of a front side dielectric 265. The semiconductor devices further comprise a back side metallization 275 that is insulated from the second main surface 120 by means of a back side dielectric 280.

FIG. 1B further shows a body contact region 225 that is disposed beneath the body region 220 and beneath a part of the drift zone 260. The body contact portion 225 connects the channel region to the source contact via the contact portions 226 so as to avoid a parasitic bipolar transistor which could be otherwise formed at this portion. Optionally, the body contact portion 225 may extend beneath the drift zone 260 so that in an off-state of the transistor, the drift zone 260 may be depleted more easily.

As is further shown in FIG. 1B, the source region 201 and the source electrode 202 may be connected to a front side metallization 720 via a conductive plug 208 and a source contact 267. Further, the drain region 205 including the drain electrode 206 may be connected to a back side metallization 275 via a conductive plug 207 and a drain contact 277 that is adjacent to the second main surface 120 which is opposite to the first main surface 110.

According to the embodiment of FIG. 1C, the source region 201 and the source electrode 202 may be connected to a back side metallization 275 via a conductive plug 208 and a source contact 267 that is adjacent to the second main surface. The drain region 205 including the drain electrode 206 may be connected with a front side metal 270 via a conductive plug 207 and a drain contact 277 that is adjacent to the first main surface 110 of the semiconductor body.

Accordingly, the semiconductor device illustrated in FIGS. 1A to 1C implements a semiconductor device comprising a transistor 200 formed in a semiconductor body 100 having a first main surface 110. The transistor comprises a source region 201, a drain region 206, a channel region 220, a drift zone 260, a source contact 267 connected to the source region, a drain contact 277 connected to the drain region 206 and a gate electrode 210 at the channel region 220. The channel region 220 and the drift zone 260 are disposed along a first direction between the source region 201 and the drain region 206. The first direction is parallel to the first main surface 110 and the channel region 220 has a shape of a ridge extending along the first direction. One of the source contact and the drain contact is adjacent to the first main surface 110, the other one of the source contact 267 and the drain contact 277 being adjacent to a second main surface 120 opposite to the first main surface 110.

The semiconductor device implements a quasi-vertical power transistor in which the current that is controlled by means of a voltage applied to the gate electrode flows in a lateral direction, i.e. parallel to the first main surface of the semiconductor body. Further, one of the source contact and the drain contact is disposed at the first main surface and the other of the source contact and the drain contact is disposed at the second main surface. Hence, the resulting current flows in a vertical direction.

Figure 1D:
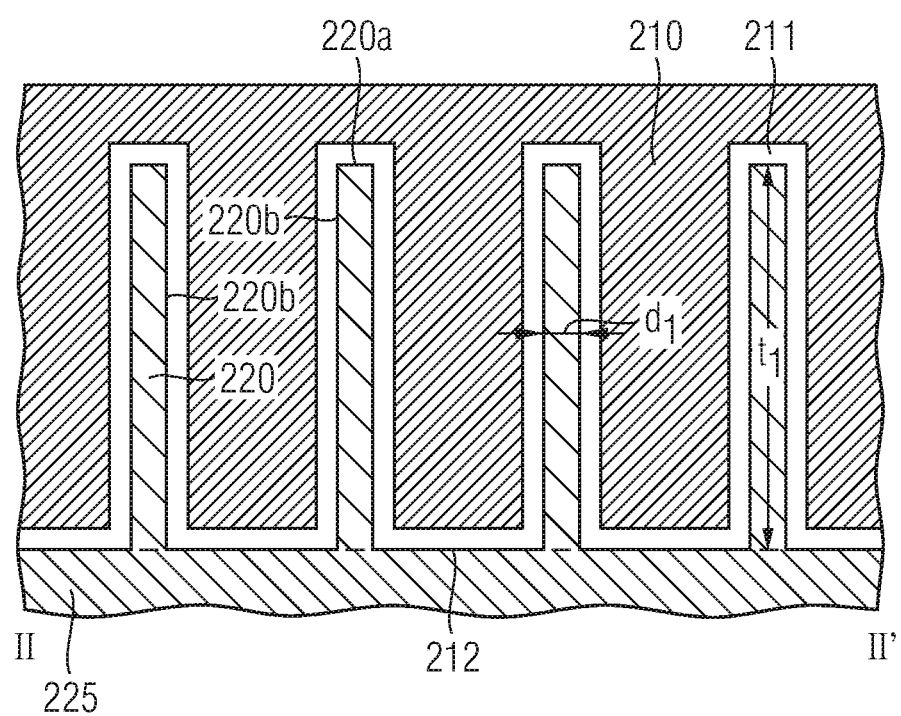
FIG. 1D shows a cross-sectional view taken perpendicularly with respect to the cross-sectional view shown in FIG. 1B or 1C, respectively.
Figure 1E:
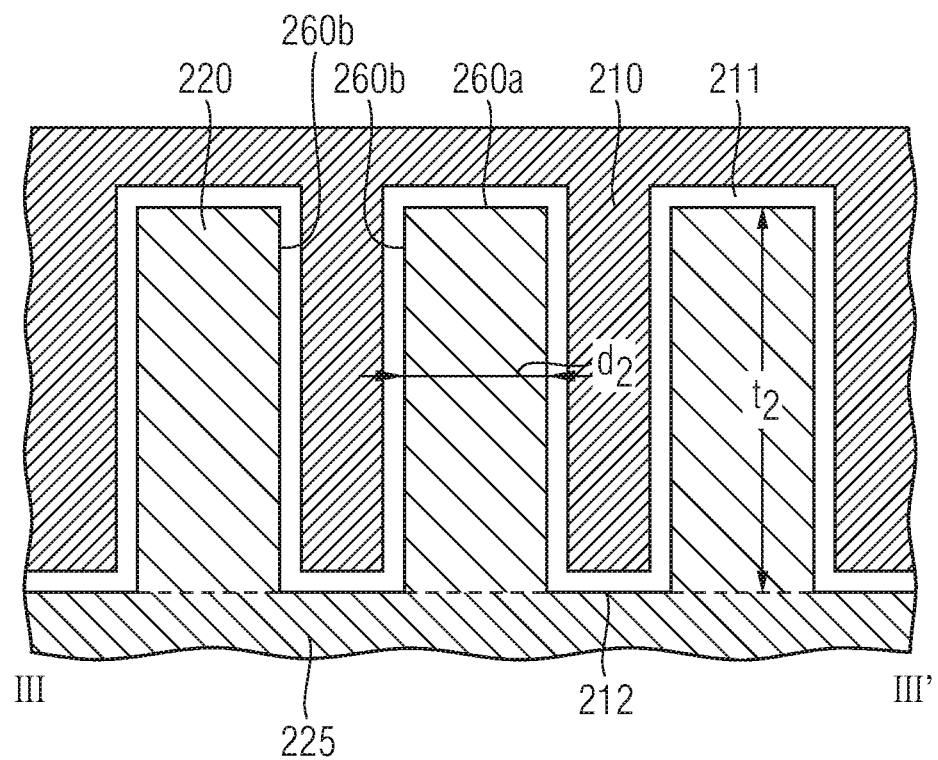
FIG. 1E shows a different cross-sectional view taken perpendicularly with respect to the cross-sectional views shown in FIGS. 1B and 1C, respectively.

FIGS. 1D and 1E illustrate cross-sectional views of the substrate or body which are taken between II and II' and III and III' in FIG. 1A. The directions between II and II' and between III and III' are perpendicular to the first direction. As is shown in FIG. 1D, the channel region 220 has the shape of a ridge, the ridge having a width $d_1$ and a depth or height $t_1$. For example, the ridge may have a top side 220a and two sidewalls 220b. The sidewalls 220b may extend perpendicularly or at an angle of more than 75° with respect to the first main surface 110. The gate electrode 210 may be disposed adjacent to at least two sides of the ridge.

Moreover, in a cross-sectional view between III and III' the drift zone 260 also may have the shape of a second ridge, the second ridge having a width $d_2$ and a depth or height $t_2$.

For example, the second ridge may have a top side 260a and two sidewalls 260b. The sidewalls 260b may extend perpendicularly or at angle of more than 75° with respect to the first main surface 110. The field plate 260 may be disposed adjacent to the top side 260a or adjacent to at least two sides of the ridge.

Beneath the channel region and, optionally, the drift zone, the deep body contact portion 225 may be disposed, as has been explained above.

According to an embodiment, the width $d_1$ of the channel region 220 is $d_1 \leq 2 \cdot l_d$, wherein $l_d$ denotes a length of a depletion zone which is formed at the interface between the gate dielectric layer 211 and the channel region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material ($11.9 \times \varepsilon_0$ for silicon, $\varepsilon_0 = 8.85 \times 10^{-14}$ F/cm), k denotes the Boltzmann constant ($1.38066 \times 10^{-23}$ J/K), T denotes the temperature, In the denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and q denotes the elementary charge ($1.6 \times 10^{-19}$ C).

Generally, it is assumed that in a transistor the length of the depletion zone at a gate voltage corresponding to the threshold voltage corresponds to the maximum width of the depletion zone. For example, the width of the first trenches may be approximately 20 to 130 nm, for example, 40 to 120 nm along the first main surface 110 of the semiconductor body 100.

Moreover, the ratio of length to width may fulfill the following relationship: $s_1/d_1 > 2.0$, wherein $s_1$ denotes the length of the ridge measured along the first direction, as is also illustrated in FIG. 1A. According to further embodiments, $s_1/d_1 = 2.5$. As is shown in FIGS. 1D and 1E, the width $d_1$ of the channel regions 220 may be different from the width $d_2$ of the drift zone 260. According to a further embodiment, the drift zone 260 may comprise a flat surface which is not patterned to form ridges as is shown in FIG. 1D.

According to the embodiment in which the width $d_1 \leq 2 \cdot l_d$, the transistor 200 is a so-called "fully depleted" transistor in which the channel region 220 is fully depleted, when the gate electrode is set to an on-potential. In such a transistor, an optimal sub-threshold voltage can be achieved and short channel effects may be efficiently suppressed, resulting in improved device characteristics.

In a transistor comprising a field plate, on the other hand, it is desirable to use a drift zone 260 having a width $d_2$ which is much larger than the width $d_1$. Due to the larger width of the drift zone $d_2$, the resistance Rds$_{on}$ of the drift zone and, thus, of the transistor may be further decreased, resulting in further improved device characteristics. In order to improve the characteristics of the semiconductor device in the channel region and to further improve the device characteristics in the drift zone, patterning the gate electrode and the field plate is accomplished so as to provide a different width of the first and the second ridges.

As has further been discussed with reference to FIGS. 1B and 1C, the source and the drain regions 201, 205 extend in the depth direction of the body. Accordingly, by appropriately setting the depth of the source and the drain region 201, 205, the electric properties of the transistors may be set in accordance with the requirements. Due to the special additional features that the gate electrode 210 and the field plate 250 extend in the depth direction adjacent to the channel region 220 and the drift zone 260, it is possible to control the conductivity of a channel that is formed in the channel region 220 by means of the gate electrode along the full depth $t_1$ of the channel region 220. In a corresponding manner, the field plate 250 influences the behavior of the drift zone along the depth $t_2$ of the second ridge. Therefore, the depth of the source region and of the drain region determine the effective width of the transistor. By setting the depth of the source and the drain regions, the width and, consequently, the characteristics of the device may be determined. For example, the depth of the source and the drain regions may be larger than 1 μm.

Figure 2A:
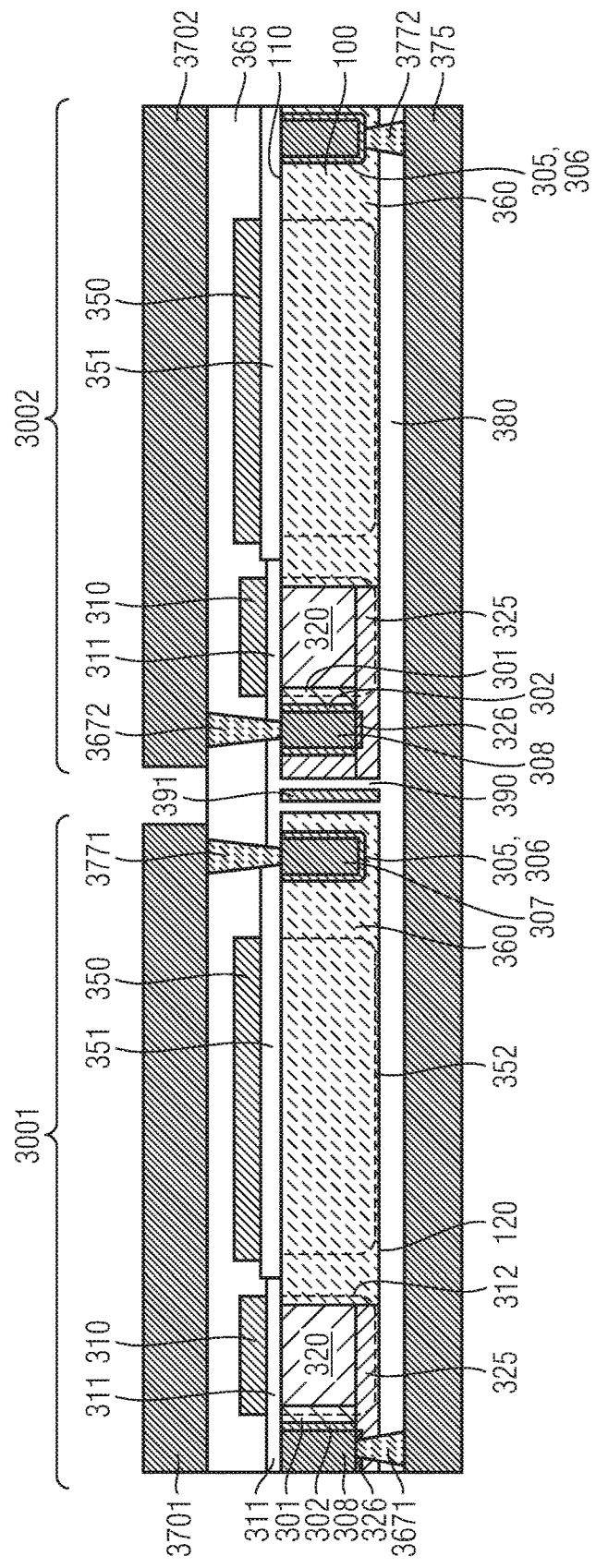
FIG. 2A shows an embodiment of an integrated circuit according to an embodiment.
Figure 2B:
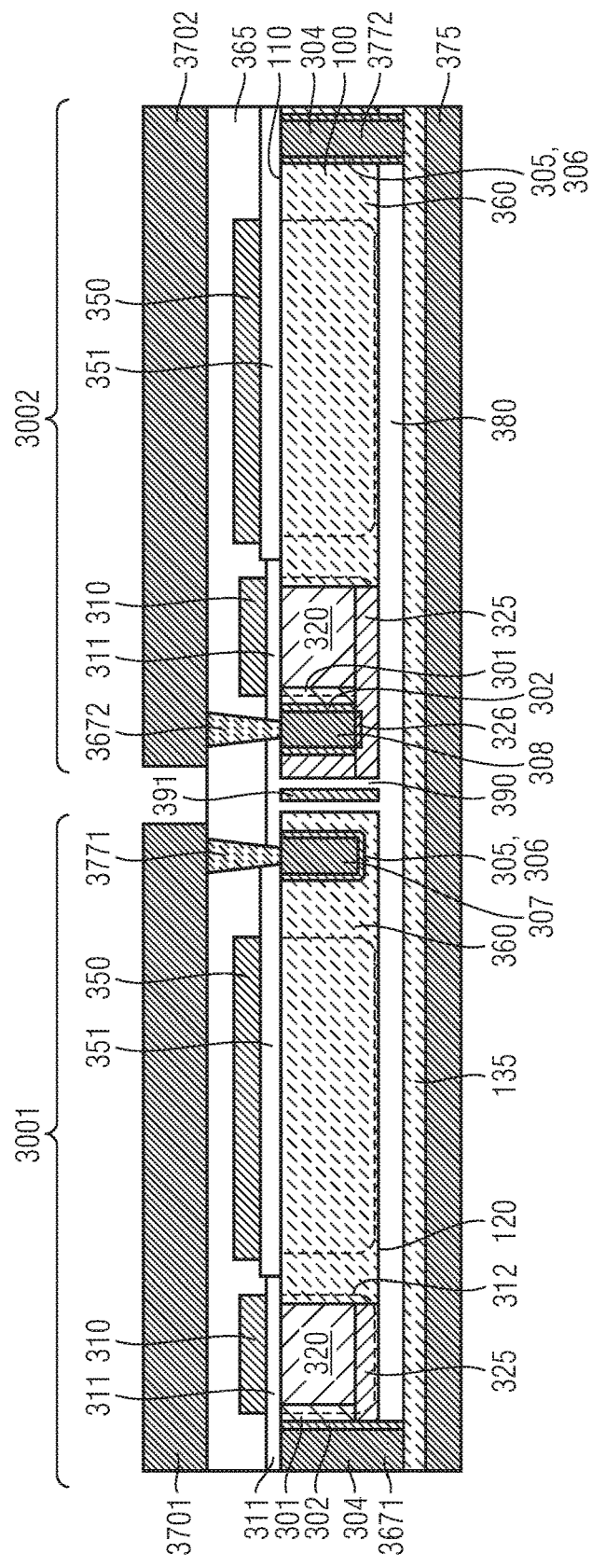
FIG. 2B shows a cross-sectional view of an integrated circuit according to a further embodiment.

FIGS. 2A, 2B and 2C illustrate examples of integrated circuits according to embodiments. According to these embodiments, an integrated circuit may comprise a plurality of semiconductor devices as has been defined above. For example, FIG. 2A illustrates an integrated circuit comprising a first transistor 3001 and a second transistor 3002. Each of the first and second transistors 3001, 3002 essentially comprise the components illustrated in FIG. 1. The transistors 3001, 3002 comprise a source region 301, a drain region 305, a channel region 320 and a drift zone 360. A gate electrode 310 having special structures as is discussed in FIG. 1 is disposed at the channel region 320. The transistors further may comprise a field plate 350 that may be disposed at the drift zone 360. The gate electrode 310 is insulated from the channel region 320 by means of the gate dielectric 311, and the field plate 350 is insulated from the drift zone 360 by means of a field dielectric layer 351. The source region 301 is coupled via a source electrode 302 to a first conductive plug 308. The drain region 305 may be implemented as a conductive layer that forms a drain electrode 306. Optionally, the drain region 305 may comprise a doped region of the first conductivity type.

As is illustrated in FIG. 2A, the first transistor 3001 may comprise a first source contact 3671 that is adjacent to the second main surface 120 of the semiconductor body 100. Further, the first transistor 3001 comprises a first drain contact 3771 that is disposed at the first main surface 110. The first source contact 3671 is connected to the source region 301 of the first transistor 3001, and the first drain contact is connected to the drain region 305 of the first transistor 3001.

A second transistor 3002 comprises essentially the same components as the first transistor 3001 so that a detailed description thereof is omitted. The second transistor 3002 is formed in the same semiconductor body 100 as the first transistor 3001. The second transistor 3002 is insulated from the first transistor 3001 by means of an isolation structure 390. For example, the isolation structure 390 may comprise an insulating material and, optionally, a conductive filling 391 that is insulated from the adjacent semiconductor material. For example, the isolation structure 390 may be formed by forming a trench in the semiconductor body and forming the respective insulating and conductive materials in this trench. For example, the trench defining the isolation structure 390 may be formed concurrently with trenches defining the field plate trenches 352 or the gate electrode trenches 312.

The second source contact 3672 is electrically connected to the source region 302 of the second transistor 3002. For example, the second source contact 3672 may be disposed at the first main surface 110 of the semiconductor body 100.

Further, the second drain contact 3772 is connected to the drain region 305 of the second transistor 3002. The second drain contact 3772 may be disposed at the second main surface 120 of the semiconductor body 100. The integrated circuit shown in FIG. 2A further comprises a front side dielectric material 365 and a front side metallization. For example, the front side metallization may comprise a front side drain metallization 3701 and a front side source metallization 3702. Further, the integrated circuit may comprise a back side metallization 375 that is connected with the source region 301 of the first transistor 3001 and the drain region 306 of the second transistor 3002. The back side metallization 375 may be insulated from the second main surface of the semiconductor body 100 by means of a back side dielectric layer 380.

For example, the front side metallization layer 3701 may be connected with a VS ("supply voltage") potential. Further the front side metallization layer 3702 may be connected with ground voltage. In addition, the back side metallization 375 may be connected with the phase terminal. For example, a bipolar load (such as a motor) may be connected to the phase. In this configuration, the motor may be provided with forward and backward current. Accordingly, the integrated circuit shown in FIG. 2A implements an integrally formed half-bridge switch that may be used for buck converters, for example.

The specific interconnection scheme of FIG. 2A is given as an example. According to further embodiments, the first source contact 3671 and the second source contact 3672 may be adjacent to the first main surface 110 of the semiconductor body, and the first drain contact 3771 and the second drain contact 3772 may be adjacent to the second main surface 120 of the semiconductor body or vice versa. The first and the second source contacts 3671, 3672 may be electrically connected to a common metallization and may, consequently, be connected to each other. The first drain contact 3771 and the second drain contact 3772 may be electrically connected to different terminals. Alternatively, the first drain contact 3771 and the second drain contact 3772 may be electrically connected to a common metallization and may, consequently, be connected to each other. In this case, the first source contact 3671 and the second source contact 3672 may electrically connected to different terminals. According to these embodiments, the integrated circuit may implement a reverse blocking switch.

FIG. 2B shows a modification of the embodiment of FIG. 2A. The integrated circuit of FIG. 2B comprises similar components as the embodiment of FIG. 2A. Differing from the embodiment of FIG. 2A, each of the first and the second transistors 3002 comprises contact openings 304 that extend from the first main surface 110 to the second main surface 120. The contact openings are filled with a conductive material to form the first source contact 3671 and the second drain contact 3772. By forming the first source contact 3671 and/or the second drain contact 3772 using a contact opening 304 extending from the first main surface 110 to the second main surface 120, the manufacturing method may be further simplified. An insulating layer 380 is disposed adjacent to the second main surface 120 and electrically insulates components of the integrated circuit from each other. The contact openings 304 are also formed in the insulating layer 380. The integrated circuit may further comprise a doped semiconductor layer 135 that is disposed between the insulating layer 380 and the back side metallization layer 375. According to an implementation, the doped semiconductor layer may have the first conductivity type. For example, the semiconductor body 100, the insulating layer 380 and the doped semiconductor layer 135 may form part of an SOI substrate.

FIG. 2C shows a cross-sectional view of an integrated circuit according to a further embodiment. According to the embodiment shown in FIG. 2C, a first and a second transistor 3001, 3002 are formed in a single semiconductor body 100. The first transistor 3001 comprises a first source region 3010, a first drain region 3050, a first gate electrode 3100 and, optionally, a first field plate 3500. The transistor 3001 further comprises a first channel region 3201 and a first drift zone 3601.

FIG. 2C is a conceptual diagram of an integrated circuit, in which the respective components are schematically illustrated without indicating the precise position of these components. In the integrated circuit shown in FIG. 2C, the first source contact 3671 is disposed at the first main surface 110 of the semiconductor body, and the first drain contact 3771 is disposed at the second main surface 120 of the semiconductor body 100. Likewise, the second transistor 3002 comprises a first source region 3010, a second drain region 3050, a second gate electrode 3100 that is adjacent to the second gate electrode and a second drift zone 3602 that may be adjacent to the field plate 3500. The first source contact 3672 is disposed at the first main surface 110 of the semiconductor body, and the second drain contact 3772 is disposed at the second main surface 120 of the semiconductor body 100. As is to be clearly understood, the integrated circuit may comprise a plurality of further transistors having the same construction. A front side metal 370 is disposed at a portion of the first main surface 110 of the semiconductor body 100. The front side metal 370 is insulated from the semiconductor body 100 by means of a front side dielectric layer 365. Further, a heavily doped body portion 130 of the second conductivity type may be disposed adjacent to the second main surface 120 of the semiconductor body 100. The body portions of the first and the second transistor 3001, 3002 may be insulated by means of an insulating structure 390. A first back side metal portion 3751 may be disposed at a portion of the first transistor 3001, and a second back side metal portion 3752 may be disposed at a portion of the second transistor 3002. Further, a first lead frame 395 may be disposed adjacent to the first back side metal 3751, and second lead frame 3096 may be disposed adjacent to the second back side metal 3752. For example, the first and the second lead frames may be connected to different potentials. For example, the second lead frame 396 may be connected to ground potential whereas the first lead frame 395 is connected to $V_{bb}$ or $V_s$. Employing the structures, several half bridges may be monolithically integrated to form a half bridge, a full bridge, a drive circuit for different kinds of motors such as a BLDG ("brushless DC") motor or a stepper motor, for example.

A further embodiment relates to a half-bridge circuit including an integrated circuit comprising first and second transistors formed in a semiconductor body having a first main surface, respectively, each of the first and the second transistors comprising a source region, a drain region, a channel region, a drift zone, a source contact electrically connected to the source region, a drain contact electrically connected to the drain region, a gate electrode at the channel region, the channel region and the drift zone being disposed along a first direction between the source region and the drain region, the first direction being parallel to the first main surface, the channel region having a shape of a first ridge extending along the first direction, one of the source contact and the drain contact of the first transistor being adjacent to the first main surface, the other one of the source contact and the drain contact of the first transistor being adjacent to a second main surface opposite to the first main surface. The source contact of the first transistor and the drain contact of the second transistor are adjacent to the first main surface and the drain contact of the first transistor and the source contact of the second transistor are adjacent to the second main surface or vice versa. According to an embodiment, the source contact of the first transistor and the drain contact of the second transistor are electrically connected with one terminal. According to this embodiment, the drain contact of the first transistor and the source contact of the second transistor are connected to different terminals.

A further embodiment relates to a bridge circuit including several half-bridge circuits as described above that are connected in a suitable manner.

Still a further embodiment relates to a reverse blocking circuit including an integrated circuit comprising first and second transistors formed in a semiconductor body having a first main surface, respectively, each of the first and the second transistors comprising a source region, a drain region, a channel region, a drift zone, a source contact electrically connected to the source region, a drain contact electrically connected to the drain region, a gate electrode at the channel region, the channel region and the drift zone being disposed along a first direction between the source region and the drain region, the first direction being parallel to the first main surface, the channel region having a shape of a first ridge extending along the first direction, one of the source contact and the drain contact of the first transistor being adjacent to the first main surface, the other one of the source contact and the drain contact of the first transistor being adjacent to a second main surface opposite to the first main surface. The source contact of the first transistor and the source contact of the second transistor are adjacent to the first main surface and the drain contact of the first transistor and the drain contact of the second transistor are adjacent to the second main surface or vice versa. According to an implementation, the source contact of the first transistor and the source contact of the second transistor are electrically connected with one terminal. According to this implementation, the drain contact of the first transistor and the drain contact of the second transistor are connected to different terminals. According to another implementation, the drain contact of the first transistor and the drain contact of the second transistor are electrically connected with one terminal. According to this implementation, the source contact of the first transistor and the source contact of the second transistor are connected to different terminals.

Generally, the semiconductor device according to embodiments, may be formed using an SOI ("silicon-on-insulator") substrate as a starting material. After forming the components of the transistor in the first main surface, the substrate may be thinned from the back side thereby uncovering the buried insulator layer. Accordingly, portions of substrate material may be removed from the back side. Thereafter, the source contact or the drain contact may be formed so as to be adjacent to a second main surface of the semiconductor substrate. Alternatively, a substrate or body without a buried oxide layer may be employed. In this case, after thinning the wafer, the back side of the wafer may be oxidized to form the back side dielectric layer. Then, the source contact or the drain contact that is adjacent to the second main surface of the body may be formed. Alternatively, a trench in which the source contact or the drain contact that is adjacent to the second main surface will be later formed, may be formed before thinning the wafer. For example, trenches may be formed using a plasma dicing method so as to achieve a high aspect ratio. According to still a further embodiment, the semiconductor device may be formed without thinning the semiconductor body. For example, an opening for forming the source contact or the drain contact may be formed so as to extend from the first main surface to the second main surface.

In the following, examples of structures will be shown while referring to different processes for forming the back side contact of the transistor. Reference is generally made to a back side contact, without explicitly determining whether the source or the drain contact implements the back side contact. As is to be clearly understood, the respective method may be equally employed for forming the source contact.

According to an embodiment, which is illustrated in FIG. 3A, after forming the components of the transistor in the first main surface 110 of the semiconductor body, a thinning process may be performed. Thereafter, a contact trench 490 for contacting the drain region 405 may be formed from the second main surface 120. For example, this may be accomplished by etching. After etching the respective trenches, an oxidation process may be performed so as to form a back side isolation layer 480 and further an isolation structure 495 that will insulate the conductive material of the contact trenches 490 from the semiconductor body 100. Thereafter, a conductive material may be filled in the contact trench 490. The resulting structure includes a drain contact adjacent to the second main surface 120 of the semiconductor body 100.

The semiconductor device shown in FIG. 3A comprises a transistor 400. The transistor 400 includes a source region 401 in contact with a source and a drain region 405 in contact with a drain electrode 406. The source region 401 and the drain region 405 are disposed along a first direction that is parallel to the first main surface 110. The channel region 420 and a drift zone 460 are disposed between the source region 401 and the drain region 405 along the first direction. A gate electrode 410 is disposed adjacent to the channel region 420, a gate dielectric 411 being disposed between the gate electrode 410 and the channel region 420. Further, a field plate 450 is disposed adjacent to the drift zone 460, the field dielectric layer 451 being disposed between the field plate and the drift zone 460. A body contact region 425 is disposed adjacent to the channel region 420 and, optionally, the drift zone 460. The back side contact trench 490 is formed in the second main surface 120 of the semiconductor body. As has been explained above, the contact trench 490 may be etched after thinning the wafer. Due to the etching of the contact trench 490 from the second main surface 120, the etching time may be reduced. According to an embodiment, forming a back side metallization and forming a conductive material in the back side contact trench may be performed by common processing steps.

According to a further embodiment, a contact opening 491 may be etched from the first surface 110 of the semiconductor body. FIG. 3B shows an example of a semiconductor device that may be manufactured using this method. The semiconductor device shown in FIG. 3B includes similar components as a semiconductor device shown in FIG. 3A. In contrast, the contact opening 491 is etched from the first main surface 110 to the second main surface 120. Due to etching the contact opening 491 from the first main surface, the wafer is patterned from one side only. Hence, handling problems and adjustment problems when aligning the first main surface with the second main surface may be avoided. After forming the contact opening 491 from the first main surface 110, an oxide layer 480 may be formed on the back side of the semiconductor body. Further, a metallization layer may be formed so as to form the back side metallization 475 and, at the same time, the conductive material defining the drain contact 477.

As a modification of this method, the contact opening 491 may be formed in the first main surface 110 so as to not to reach the second main surface 120. In this case, a contact doping 497 may be formed in a lower portion of the semiconductor body beneath the contact opening 491 so as to accomplish a contact to the second main surface 120. FIG. 3C shows an example of a semiconductor device that may be manufactured using this method. As is shown, the contact opening 491 is formed in the first main surface 110 of the semiconductor body. Further, a contact doping 497 is disposed beneath the contact opening 491 and extends to the second main surface 120 of the semiconductor body. Optionally, a further doped body portion may be disposed beneath the doped portion 130. For example, the further doped portion may have the first conductivity type and may be doped with dopants of the first conductivity type at a higher doping concentration than the portion 130. Thereafter, further processing steps may be performed so as to define the drain contact.

According to the described embodiments, one of the source contact and the drain contact is adjacent to the first main surface, the other one of the source contact and the drain contact being adjacent to a second main surface opposite to the first main surface. Nevertheless, as becomes apparent from the drawings, the source and the drain regions may be adjacent to the first main surface, even though the corresponding contact is disposed adjacent to the second main surface. When the source and the drain regions are adjacent to the first main surface, the semiconductor device implements a lateral semiconductor device in which a current flow mainly is accomplished in a direction parallel to the first main surface.

Figure 4:
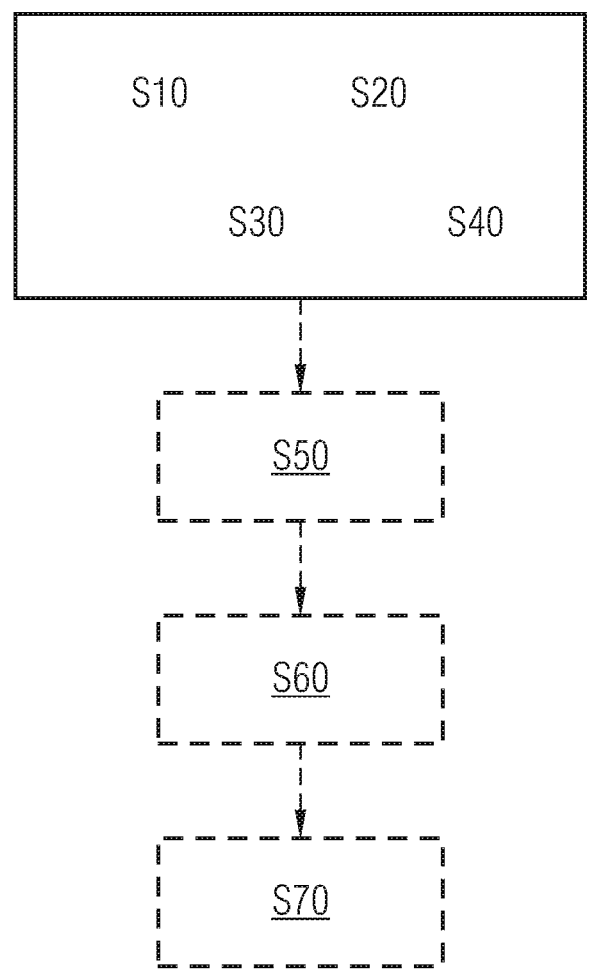
FIG. 4 illustrates a flowchart of a method of forming a semiconductor device according to an embodiment.

FIG. 4 summarizes a method of forming a semiconductor device according to an embodiment. A method of manufacturing a semiconductor device comprises forming a transistor in a semiconductor body having a first main surface. Forming the transistor comprises forming a source region, forming a drain region, forming a channel region, forming a drift zone (S10), forming a source contact electrically connected to the source region (S20) and forming a drain contact electrically connected to the drain region (S30). The method further comprises forming a gate electrode (S40) at the channel region. The channel region and the drift zone are formed so as to be disposed along a first direction between the source region and the drain region, the first direction being parallel to the first main surface, and the channel region being formed to have a shape of a first ridge extending along the first direction. One of the source contact and the drain contact being formed adjacent to the first main surface, the other one of the source contact and the drain contact being formed adjacent to a second main surface opposite to the first main surface.

The method may further comprise thinning (S50) the semiconductor body and, optionally, forming an insulating layer (S60) over a second main surface of the body. Further, the method may comprise forming (S70) a back side contact opening extending from the first main surface to the second main surface. The method may further comprise forming gate trenches in the first main surface. According to an embodiment, the method comprises forming field plate trenches in the first main surface.

For example, forming components of the transistor may comprise forming the components in the first main surface of the semiconductor body. The method may further comprise removing a portion of the semiconductor body from the second main surface to thin the semiconductor body. The semiconductor body may be a silicon-on-insulator substrate, and the portion of the semiconductor substrate is removed to uncover an insulator layer buried in the semiconductor substrate. The method may further comprise forming an insulator layer over the second main surface. Forming the source contact or the drain contact that is adjacent to the second main surface may comprise etching a contact trench in the second main surface. Alternatively, the contact trench may be etched in the first main surface. The method may further comprise forming back side contact openings extending from the first main surface to the second main surface. The method may further comprise forming gate trenches or field plate trenches in the first main surface. Forming the gate trenches or forming the field plate trenches may be performed by joint processing methods. According to an embodiment, the back side contact openings have a width and a depth larger than a width and a depth of the gate trenches or the field plate trenches.

The following Figures illustrate various embodiments of a semiconductor device, e.g. the semiconductor device that has been discussed above, further comprising interconnection elements 633 to accomplish an interconnection between the first main surface 110 and the second main surface 120. The interconnection elements 633 may be arranged in different manners. The semiconductor device shown in FIG. 5A comprises a transistor 500 having a similar configuration as the semiconductor devices shown in the previous Figures. The semiconductor device comprises a transistor 500 including a source region 501, a source electrode 502, a channel region 520, a drift zone 560 and a drain region 505 connected to or including a drain electrode 506. The source region and the drain region are disposed adjacent to the first main surface. The channel region and the drift zone are disposed adjacent to the first main surface. The gate electrode 510 is disposed between the source and the drain region. The semiconductor device further comprises a contact opening extending from the first main surface to a second main surface opposite to the first main surface. According to an embodiment, the gate electrode 510 is illustrated as being disposed in various gate trenches 512. It is to be noted that the gate trenches 512 extend in a direction that is perpendicular with respect to the shown cross-sectional view. The structure including the trenches 512 is merely illustrated in order to indicate that the gate electrode may be arranged in these trenches 512 that extend parallel to the shown plane of the drawing. In more detail, the gate electrode may be as illustrated in FIGS. 1A, 1B, 1C, and 1D. In a similar manner, field plate trenches 552 may extend in the direction that is parallel to the depicted plane of the drawing. The field plate trenches including the field plates may be as illustrated in FIGS. 1A, 1B, 1C and 1E, respectively.

The gate electrode 510 is electrically connected via gate contact 568 to a gate metallization 530. The gate metallization 530 may be disposed on the side of the first main surface 110. The gate metallization 530 may be insulated from the first main surface by means of a front side dielectric layer 565. The semiconductor device further comprises a field plate 550 that is arranged in field plate trenches 552. The field plate 550 comprises a conductive material that is electrically connected via a field plate contact 536 to the back side metallization 575 that is held at a source potential.

Further, the drain region 505 may be connected with a drain metallization 532 by means of a drain contact 577. The drain metallization 532 may be disposed on a side of the first main surface 110 of the semiconductor body. The drain metallization 532 and the gate metallization 530 are insulated from each other and may extend in a plane perpendicularly with respect to the depicted plane of the drawing. A back side metal 575 is disposed on the side of the second main surface 120 of the semiconductor body. The back side metallization 575 may be insulated from the second main surface 120 by means of a back side dielectric layer 580. The source region 502 may be connected with the back side metallization 575 by means of a source contact 567. According to the embodiment of FIG. 5A, the semiconductor device further comprises an interconnection element 633 that provides a connection between the back side metallization 575 and a front side contact 531. For example, the front side contact 531 may implement a source sense contact. According to the embodiment of FIG. 5A, the interconnection element 633 may be arranged in a back side contact opening 553 that has a shape similar to a field plate trench 552.

According to this embodiment, the back side contact opening 553 may be formed concurrently with the field plate trenches 552. An insulating material such as the insulating material forming the field plate dielectric 551 may be formed adjacent to the sidewalls of the back side contact opening 553. Further, a conductive material such as the conductive material forming the field plate may be filled in the back side contact opening 553. The interconnection element 633 is connected via a back side metal contact 535 to the back side metallization layer 575. Further, the interconnection element 633 is connected with a front side contact 531 via a contact portion 534.

According to the shown embodiment, some of the trenches 552, 553 disposed adjacent to the drift zone 560 may implement a field plate trench 552 and may be connected with a back side metallization 575 only, whereas others of the trenches 553 implement an interconnection structure 633 and are connected with the front side contact 531 and the back side metallization 575. The front side contact 531 implements a source sense contact. In the embodiment illustrated in FIG. 5A, the source region and the drain region are formed adjacent to the first main surface that is on a side of the top side of the semiconductor device. Further, the gate electrode 510 is adjacent to the first main surface that is on a side of the front side of the semiconductor device.

According to a further embodiment, the semiconductor device may be flipped, so that the first main surface 110 of the semiconductor body and the respective components adjacent to the first main surface 110 are disposed on a back side of the semiconductor device.

Figure 5A:
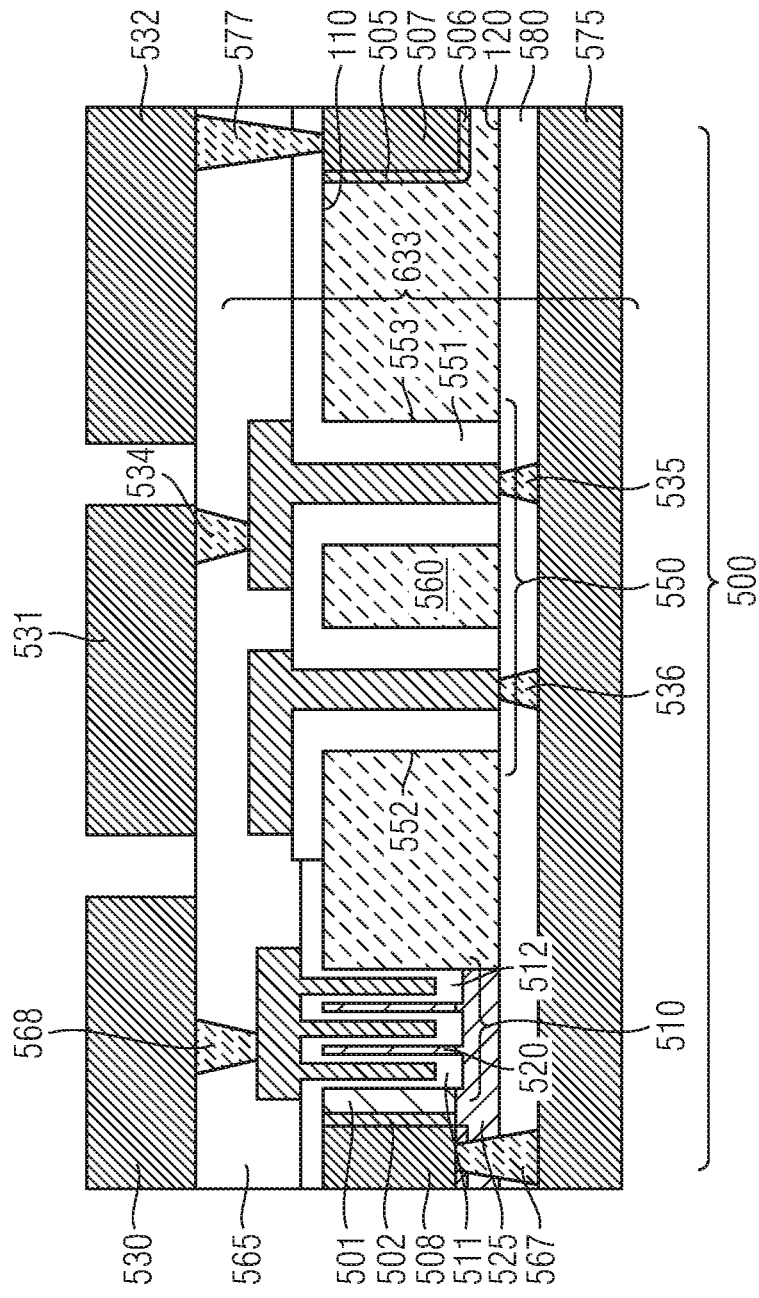
FIG. 5A shows a cross-sectional view of a semiconductor device according to an embodiment.
Figure 5B:
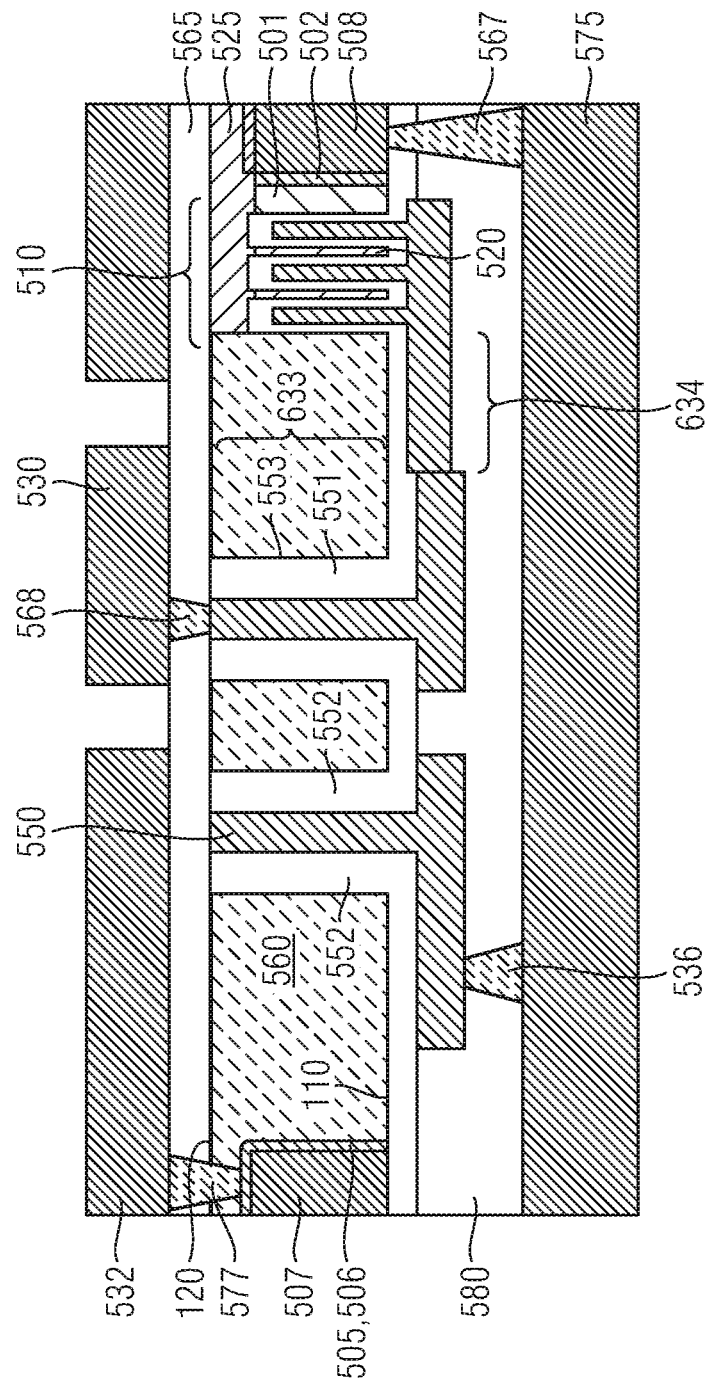
FIG. 5B shows a cross-sectional view of a semiconductor device according to a further embodiment.

FIG. 5B shows a corresponding structure. As is shown, after forming the respective components of the transistor, the body is flipped so that the first main surface 110 is adjacent to a back side of the semiconductor device. Accordingly, the semiconductor device shown in FIG. 5B comprises a source region 501 connected to a source electrode 502, a channel region 520, a drift zone 560 and a drain region 505 that is connected to or includes a drain electrode 506. The drain electrode 506 is connected via a metal plug 507 and a drain contact 577 to a front side metal portion 532 that is disposed on a front side of the semiconductor device.

Further, the source electrode 502 is electrically connected via a metal plug 508 and a source contact 567 to a back side metallization 575 which is held at source potential. According to the shown structure, the gate electrode 510 is connected with a gate electrode pad 530 that is disposed on a front side of the semiconductor device via an interconnection element 633 extending across the semiconductor device from the first main surface 110 to the second main surface 120. The semiconductor device shown in FIG. 5B further comprises a gate contact structure that connects the gate electrode 510 with the interconnection element 633. In a similar manner as has been illustrated in FIG. 5A, the interconnection element 633 may be disposed in a back side contact opening 553 having a similar shape as the field plate trenches 552. The back side contact opening 553 is filled with an insulating material and a conductive material.

According to the embodiment shown in FIG. 5B, some of the trenches 552, 553 are filled with a conductive material for forming the field plate 550, the conductive material being connected to the back side metallization 575 only, whereas the conductive material within other trenches 553 is connected with a gate contact 530 that is disposed on the front side of the semiconductor device.

Accordingly, the semiconductor device illustrated in FIGS. 5A and 5B comprises a transistor 500 formed in a semiconductor body 100 having a first main surface 110. The transistor comprises a source region 501, 502, a drain region 505, 506, a channel region 520, a drift zone 560, and a gate electrode 510 at the channel region 520. The channel region 520 and the drift zone 560 are disposed along a first direction between the source region 501, 502 and the drain region 505, 506, the first direction being parallel to the first main surface 110. The channel region 520 has a shape of a first ridge extending along the first direction. The semiconductor device further includes a back side contact opening 553 extending from the first main surface 110 to a second main surface 120 opposite to the first main surface 110. For example, the semiconductor device may further comprise a conductive filling in the back side contact opening 553, the conductive filling being insulated from an adjacent semiconductor body material.

Figure 5C:
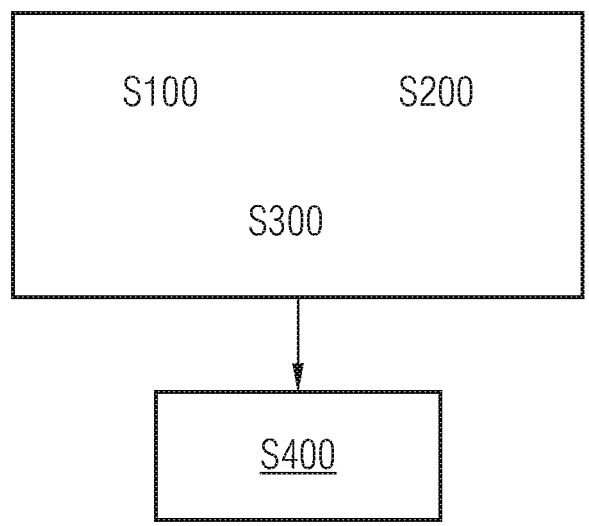
FIG. 5C is a flowchart of a method of forming a semiconductor device according to an embodiment.

FIG. 5C illustrates a method of manufacturing a semiconductor device. The method comprises forming a transistor in a semiconductor body having a first main surface. Forming the transistor comprises forming a source region and a drain region adjacent to the first main surface S100, forming a channel region and a drift zone adjacent to the first main surface S200, and forming a gate electrode S300 between the source and the drain region. Forming the gate electrode comprises forming a gate trench in the first main surface. The method further comprises forming a contact opening extending from the first main surface to the second main surface opposite to the first main surface S400.

The method may further comprise forming gate trenches or field plate trenches in the first main surface. For example, the gate trenches 512 may be formed so as to implement a channel region having a shape of a ridge. Optionally, field plate trenches may be formed so as to implement a drift zone having a shape of a ridge. Forming the gate trenches or field plate trenches and forming the contact openings may be performed by joint processing methods. The contact openings may have a width and a depth larger than a width and a depth of the gate trenches or the field plate trenches. For example, the contact openings may have a width and a depth larger than a width and a depth of the gate trenches or the field plate trenches. According to an embodiment, forming the gate trenches or forming the field plate trenches comprises an etching method that etches the contact openings at a higher etching rate than the gate trenches and the field plate trenches. According to an embodiment, the method may further comprise removing a portion of the semiconductor body from the second main surface to thin the semiconductor body.

For example, the contact openings may have a width and a depth larger than a width and a depth of the gate trenches or the field plate trenches. According to an embodiment, forming the gate trenches or forming the field plate trenches comprises an etching method that etches the contact openings at a higher etching rate than the gate trenches and the field plate trenches. According to an embodiment, the method may further comprise removing a portion of the semiconductor body from the second main surface to thin the semiconductor body.

The interconnection element 633 may be disposed at arbitrary positions within the semiconductor device or the integrated circuit. For example, as has been mentioned above, some of the field plate trenches 552 may be formed so as to form the interconnection element 633.

Figure 6A:
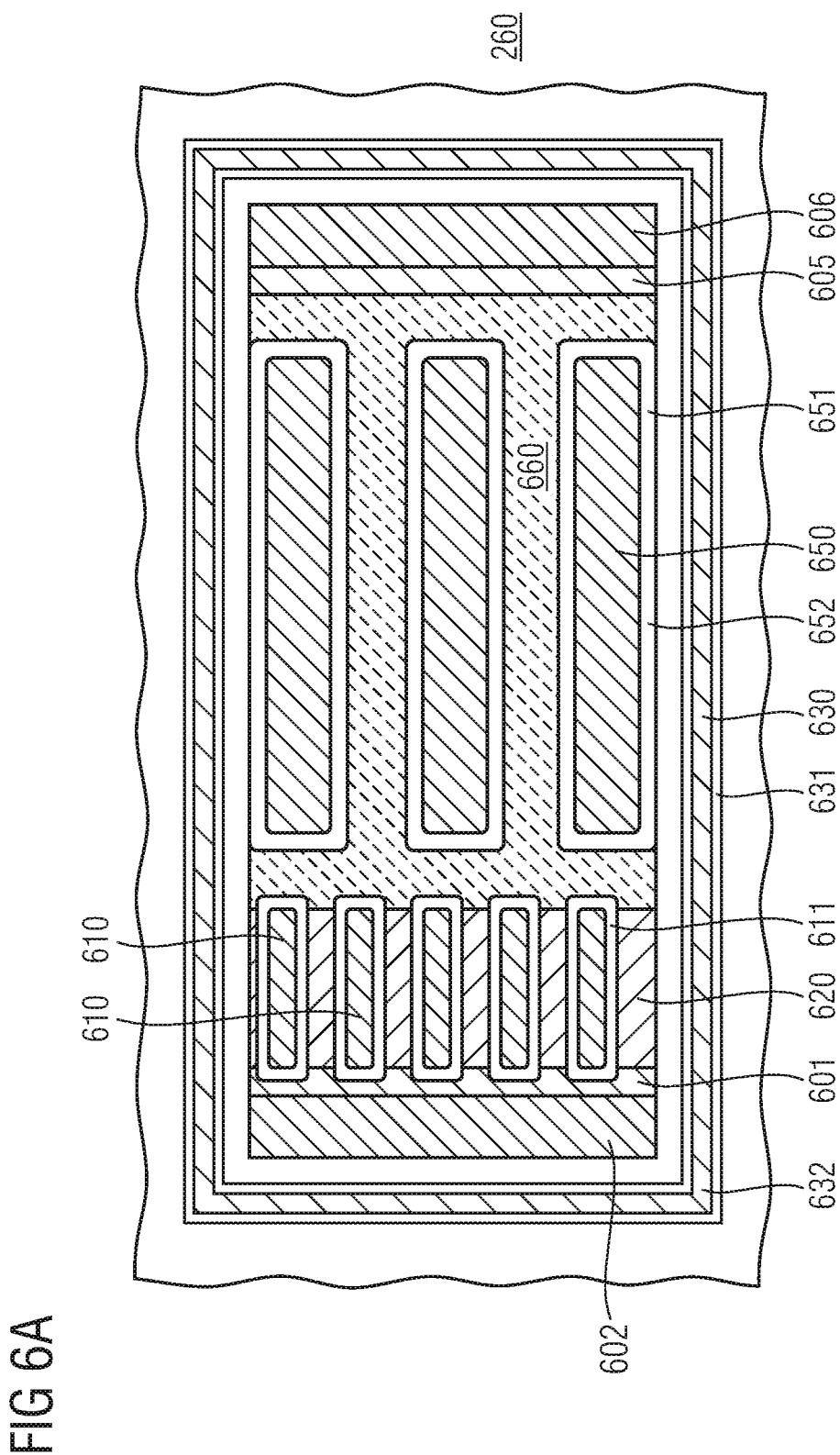
FIGS. 6A to 6C show plan views of a semiconductor device according to embodiments.

According to a further embodiment, the semiconductor device including a plurality of single transistor cells comprising respective gate electrodes 610 may be surrounded by a contact opening that forms the interconnection element 633. FIG. 6A shows a corresponding semiconductor device. The semiconductor device shown in FIG. 6A comprises a source region 601 connected to a source electrode 602, a channel region 620, a drift zone 660 and a drain region 605 connected to a drain electrode 606. The gate electrode 610 is disposed at the channel region 620. The gate electrode 610 is insulated from the channel region 620 by means of a gate dielectric layer 611. Further, the field plates 650 are arranged in field plate trenches 652. The field plates 650 are insulated from the drift zone 660 by means of a field dielectric 651. The field plate 650 may be omitted or may be implemented in a different manner. The semiconductor device including a plurality of single transistor cells is surrounded by a contact opening 630. A conductive filling 632 is disposed in the contact openings 630, the conductive filling 632 being insulated from adjacent semiconductor material by means of a dielectric material 631. The contact openings may extend from a first main surface 110 of the semiconductor device to the second main surface 120 of the semiconductor device. The contact openings 630 and the field plate trenches 652 may be formed by common or simultaneous processing steps.

Figure 6B:
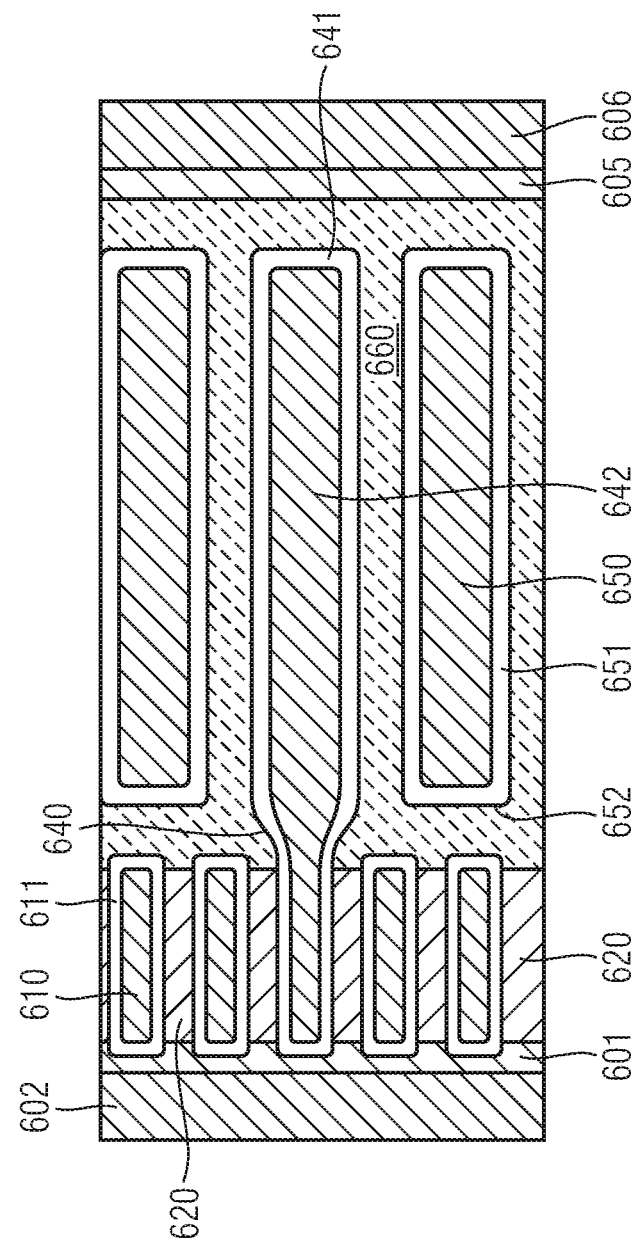

FIG. 6B shows a further semiconductor device comprising field plate trenches 642 and combined contact openings 640. Field plates 650 are disposed within the field plate trenches 652 in a similar manner as has been described in FIG. 1, for example. The semiconductor device further comprises combined contact openings 640 having a conductive filling 642 which is held at a gate potential. The conductive filling 642 within the combined contact openings 640 is insulated from the drift zone 660 by means of a dielectric material 641. Another portion of the conductive filling implements a gate electrode 610 in a region adjacent to the channel region 620. The combined contact openings 640 do not extend to the second main surface 120 in the region adjacent to the channel region 620. In a region adjacent to the drift zone 660, the combined contact openings may, for example, implement the interconnection element 633 that is illustrated in FIG. 5B. In this region, the combined contact openings 640 may extend from the first main surface 110 to the second main surface 120. The larger depth of the contact openings 640 in the different regions may result from a different width of the trench regions. The further components of the semiconductor device shown in FIG. 63 are similar to those shown in FIG. 6A.

Figure 6C:
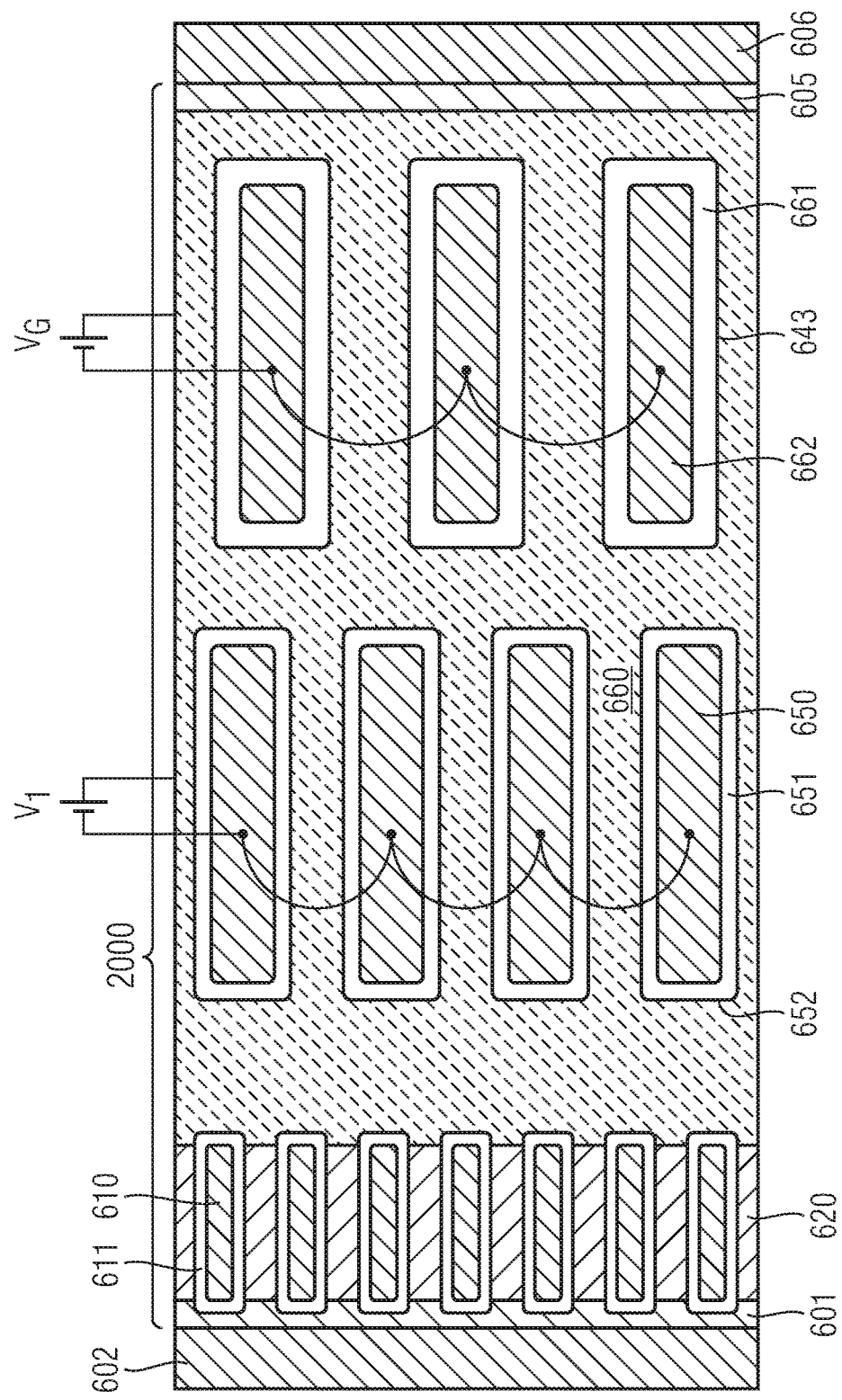

According to a further embodiment, the semiconductor device may comprise second trenches 643 that are disposed between the field plate trenches 652 and the drain region 605 along the first direction. The second trenches 643 are filled with a conductive material 662, the conductive material 662 being insulated from adjacent semiconductor material by means of a second dielectric material 661. For example, the conductive material 662 within the second trenches 643 may be held at gate potential and, thus, implement the interconnection element illustrated in FIG. 53. The further components of the semiconductor device illustrated in FIG. 6C are identical with the respective components of the semiconductor device shown in FIG. 1 or 6A.

FIGS. 7 and 8 illustrates elements of methods for forming a semiconductor device according to embodiments.

Figure 7A:
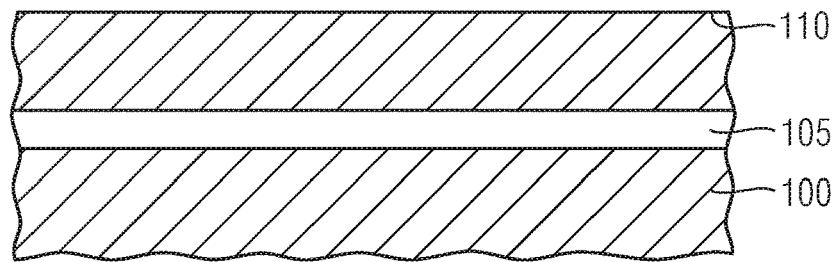
FIGS. 7A to 7D show cross-sectional views of a semiconductor device when performing the method of manufacturing a semiconductor device according to an embodiment.
Figure 7B:
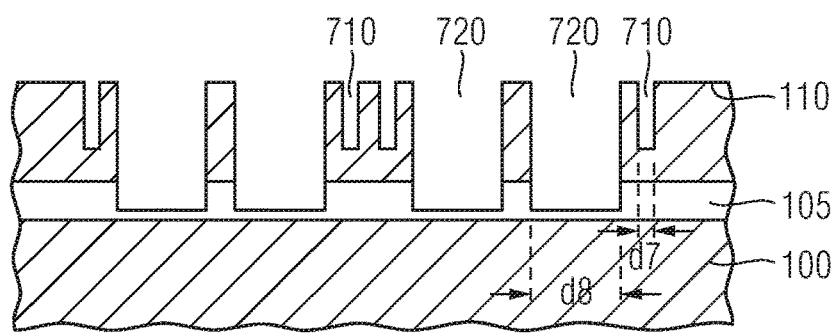

FIG. 7A shows a semiconductor body or substrate 100 having a buried oxide layer 105. First trenches 710 and second trenches 720 are formed in the first main surface 110 of the semiconductor body 100. The first trenches 710 and the second trenches 720 may be photolithographically defined as is conventional. For example, the first trenches 710 may have a smaller width C 17 than the second trenches (Is, the width being measured in the direction parallel to the plane of the drawing. Thereafter, an etching step is performed as is conventional. Due to the increased width (Is of the second trenches 720, the trenches may be etched at a higher etching rate than the first trenches 710. For example, the trenches may be etched using an anisotropic etching method such as an RIE ("reactive ion etching") method. Accordingly, the second trenches 720 have a deeper depth than the first trenches 710. The second trenches 720 extend to the buried oxide layer 105. FIG. 7B shows an example of a resulting structure.

Figure 7C:
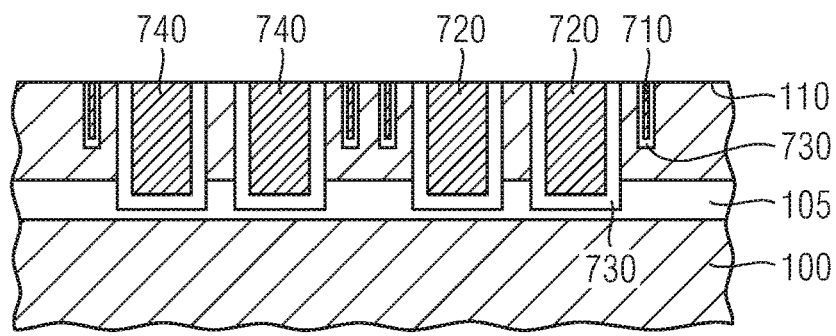
Figure 7D:
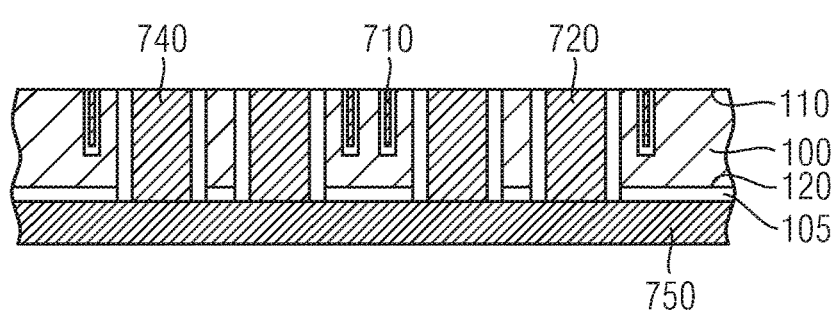

Thereafter, a dielectric layer 730 is formed in each of the trenches, followed by a conductive layer 740. A planarization step is performed. FIG. 7C shows an example of the resulting structure.

Thereafter, a thinning process may be performed so as to remove the substrate portions beneath the buried oxide layer 105. For example, this may be accomplished by etching, grinding or a CMP (chemical mechanical polishing) method. A portion of the buried oxide layer 105 is maintained after this process. Then, a further metallization layer 750 may be formed over the back side of the semiconductor body. As a result, the structure shown in FIG. 7D may be obtained. As is shown, the second trenches 720 may extend to the back side metallization layer 750, whereas the first trenches 710 do not extend to the buried oxide layer 105. For example, the first trenches 710 implement the gate trenches which have been explained herein further, the second trenches 720 may implement the field plate trenches. The second trenches 720 may simultaneously act as contact openings. Using the above-mentioned processing steps, the first and the second trenches 710, 720 may be formed using common and simultaneous processing steps. As is to be clearly understood, according to alternative methods, the first and the second trenches may be formed using different processes.

According to a further embodiment, which is illustrated in FIG. 8 third trenches 725 may be formed in the semiconductor body. Further, the first and the second trenches 710, 720 may be formed so that neither the first trenches 710 nor the second trenches 720 extend to the buried oxide layer 105. Using this process, dedicated contact openings 725 may be formed, while simultaneously forming gate trenches and field plate trenches. Starting point for performing the method according to this embodiment may be a SOI substrate, as is shown in FIG. 8A, for example. The SOI substrate 100 comprises a buried oxide layer 105. Thereafter, first trenches 710, second trenches 720 and third trenches 725 are formed in the first main surface 110 of the semiconductor substrate.

Figure 8A:
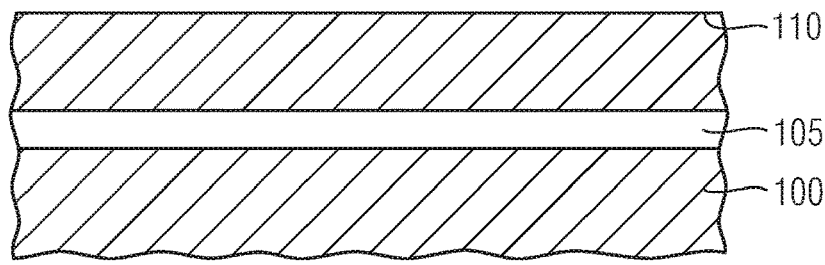
FIGS. 8A to 8D illustrate cross-sectional views of a semiconductor device when performing the method of manufacturing a semiconductor device according to an embodiment.
Figure 8B:
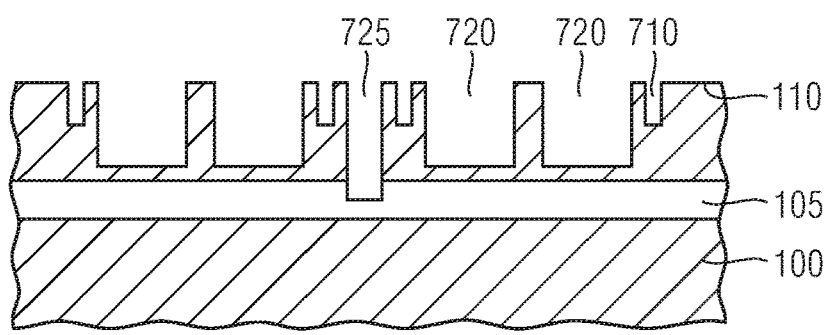

Although not explicitly shown in FIG. 8B, the third trenches 725 have a width d 9 in a direction perpendicularly with respect to the depicted plane of the drawing which is much larger than the width of the field plate trenches 720 and the first trenches 710. For example, the third trenches 725 may implement a ring structure, as is also shown in FIG. 6B. Accordingly, using one single etching method, the third trenches 725 may be etched to a much deeper depth than the first trenches 710 and the second trenches 720. For example, the third trenches 725 may be etched to extend to the buried oxide layer 105. Thereafter, a dielectric layer 730 is deposited followed by a conductive layer 740.

Figure 8C:
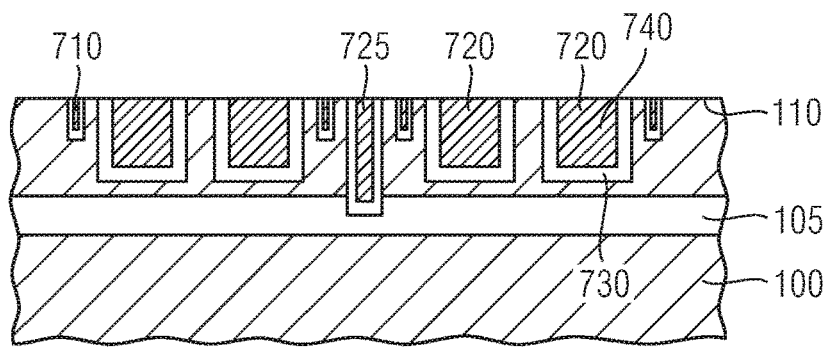
Figure 8D:
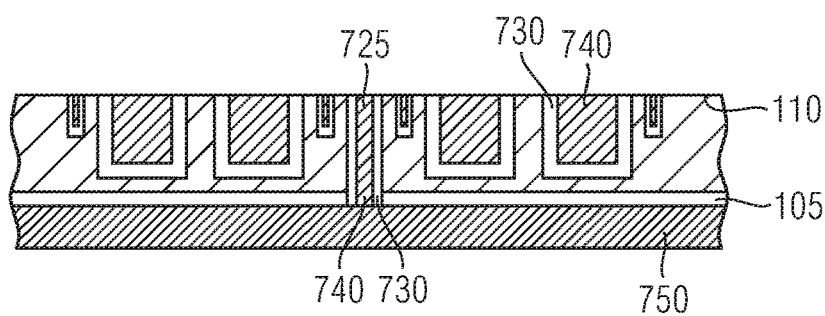

FIG. 8C shows an example of the resulting structure. Thereafter, a thinning method is performed so as to remove the substrate material beneath the buried oxide layer 105 and a portion of the buried oxide layer 105 so as to uncover a bottom portion of the conductive material 740 within the third trench 725. Then, a back side metallization layer 750 may be formed as the bottom side of the buried oxide layer 105. FIG. 8D shows an example of the resulting structure. As is shown, a connection element is implemented by the third trench 725 including a conductive filling 740 that contacts the back side metallization layer 750.

While embodiments of the invention have been described above, further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor in a semiconductor body having a first main surface, the transistor comprising: a source region; a drain region; a channel region, a drift zone; a source contact electrically connected to the source region; a drain contact electrically connected to the drain region; a gate electrode at the channel region, the channel region and the drift zone being disposed along a first direction between the source region and the drain region, the first direction being parallel to the first main surface, the channel region patterned into a first ridge by adjacent gate trenches formed in the first main surface of the semiconductor body, the adjacent gate trenches being spaced apart in a second direction perpendicular to the first direction, wherein a longitudinal axis of the first ridge and a longitude axis of the gate trenches extend in the first direction; and at least one of the source contact and the drain contact being adjacent to a second main surface that is opposite to the first main surface.

2. The semiconductor device of claim 1, further comprising a back side metallization over the second main surface and connected to the source contact or the drain contact adjacent to the second main surface.

3. The semiconductor device of claim 2, further comprising a sense contact at the first main surface and connected with the back side metallization via a back side contact.

4. The semiconductor device of claim 3, wherein the back side contact is disposed in a back side contact opening extending from the first to the second main surface.

5. The semiconductor device of claim 1, wherein the source and the drain region are disposed adjacent to the first main surface.

6. The semiconductor device of claim 1, wherein portions of the gate electrode are disposed in the gate trenches.

7. The semiconductor device of claim 1, further comprising an insulating layer in contact the second main surface.

8. The semiconductor device of claim 1, wherein the drain contact is adjacent to the second main surface, the drain contact comprising a drain contact trench contacting the drain region and a conductive material in the drain contact trench.

9. The semiconductor device of claim 1, wherein the source contact is adjacent to the second main surface, the source contact comprising a source contact trench contacting the source region and a conductive material in the source contact trench.

10. The semiconductor device of claim 9, wherein the source contact trench does not extend to the first main surface.

11. The semiconductor device of claim 8, wherein the drain contact trench extends to the second main surface.

12. The semiconductor device of claim 8, wherein the drain contact trench extends to the first main surface.

13. The semiconductor device of claim 8, wherein the drain contact trench does not extend to the first main surface.

14. The semiconductor device of claim 8, wherein the drain contact trench does not extend to the second main surface, the drain contact further comprising a doped body portion.

15. An integrated circuit comprising first and second transistors in a semiconductor body having a first main surface, respectively, each of the first and the second transistors comprising: a source region; a drain region,
a channel region; a drift zone; a source contact electrically connected to the source region; a drain contact electrically connected to the drain region; a gate electrode at the channel region, the channel region and the drift zone being disposed along a first direction between the source region and the drain region, the first direction being parallel to the first main surface, the channel region patterned into a first ridge by adjacent gate trenches formed in the first main surface of the semiconductor body, the adjacent gate trenches being spaced apart in a second direction perpendicular to the first direction, wherein a longitudinal axis of the first ridge and a longitude axis of the gate trenches extend in the first direction; and at least one of the source contact and the drain contact of the first transistor being adjacent to a second main surface that is opposite to the first main surface.

16. The integrated circuit of claim 15, wherein the source contact of the first transistor and the drain contact of the second transistor are adjacent to the second main surface.

17. The integrated circuit of claim 16, further comprising a metallization layer electrically connecting the source contact of the first transistor and the drain contact of the second transistor.

18. The integrated circuit of claim 16, further comprising an isolation trench insulating the first transistor from the second transistor, the isolation trench being disposed between the first and the second transistor.

19. The integrated circuit of claim 15, wherein the source contacts of the first and the second transistors are adjacent to the second main surface.

20. The integrated circuit of claim 15, wherein the drain contacts of the first and the second transistors are adjacent to the second main surface.

* * * * *